United States Patent
Wada

(10) Patent No.: US 8,883,883 B2
(45) Date of Patent: Nov. 11, 2014

(54) RESIN COMPOSITION FOR ENCAPSULATING SEMICONDUCTOR AND SEMICONDUCTOR DEVICE

(75) Inventor: Masahiro Wada, Tokyo (JP)

(73) Assignee: Sumitomo Bakelite Co., Ltd., Tokyo (JP)

(*) Notice: Subject to any disclaimer, the term of this patent is extended or adjusted under 35 U.S.C. 154(b) by 335 days.

(21) Appl. No.: 13/322,037

(22) PCT Filed: May 28, 2010

(86) PCT No.: PCT/JP2010/003603
§ 371 (c)(1),
(2), (4) Date: Nov. 22, 2011

(87) PCT Pub. No.: WO2010/140331
PCT Pub. Date: Dec. 9, 2010

(65) Prior Publication Data
US 2012/0061861 A1 Mar. 15, 2012

(30) Foreign Application Priority Data
Jun. 3, 2009 (JP) .................. P2009-134319

(51) Int. Cl.
*C08G 59/62* (2006.01)
*C08L 63/00* (2006.01)
(Continued)

(52) U.S. Cl.
CPC ............ *H01L 23/293* (2013.01); *C08G 59/621* (2013.01); *C08G 59/688* (2013.01); *C08L 63/00* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/73265* (2013.01); *H01L 2924/10253* (2013.01); *H01L 2924/15311* (2013.01); *H01L 2924/15747* (2013.01); *H01L 2224/45144* (2013.01); *H01L 2224/48011* (2013.01); *H01L 24/45* (2013.01); *H01L 24/48* (2013.01); *H01L 2224/45015* (2013.01)
USPC ........... 523/400; 523/451; 523/457; 257/793; 525/480; 525/523; 525/534

(58) Field of Classification Search
CPC ......... C08G 59/62; C08L 61/06; C08L 63/00; C08L 63/04; C08K 3/22; H01L 23/29
USPC .......... 252/534; 528/151, 153, 155, 212, 218; 523/400, 457; 525/523, 534, 457
See application file for complete search history.

(56) References Cited

U.S. PATENT DOCUMENTS 6,383,660 B2 5/2002 Igarashi
7,157,313 B2 1/2007 Kuroda
(Continued)

FOREIGN PATENT DOCUMENTS

CN 1316447 A 10/2001
CN 1738864 A 2/2006
(Continued)

OTHER PUBLICATIONS

International Search Report issued in PCT/JP2010/003603, dated Aug. 24, 2010.

*Primary Examiner* — Randy Gulakowski
*Assistant Examiner* — Ha Nguyen
(74) *Attorney, Agent, or Firm* — Birch, Stewart, Kolasch & Birch, LLP

(57) ABSTRACT

Disclosed is a resin composition for encapsulating a semiconductor including a phenol resin (A) having one or more components containing a component (A1) composed of a polymer having a first structural unit and a second structural unit, an epoxy resin (B), and an inorganic filler (C). Also disclosed is a semiconductor device obtained by encapsulating a semiconductor element with a cured product of the resin composition for encapsulating a semiconductor.

18 Claims, 10 Drawing Sheets

(51) Int. Cl.
*C08L 61/04* (2006.01)
*C08K 3/00* (2006.01)
*H01L 23/29* (2006.01)
*C08G 59/68* (2006.01)
*H01L 23/00* (2006.01)

(56) References Cited

U.S. PATENT DOCUMENTS

| | | |
|---|---|---|
| 2002/0006986 A1 | 1/2002 | Igarashi |
| 2004/0232532 A1 | 11/2004 | Kuroda |
| 2005/0267237 A1* | 12/2005 | Kuroda .................. 523/443 |
| 2005/0267286 A1* | 12/2005 | Nakamura et al. ............ 528/408 |
| 2011/0124775 A1 | 5/2011 | Wada |

FOREIGN PATENT DOCUMENTS

| | | |
|---|---|---|
| JP | 52-014391 A | 2/1977 |
| JP | 53-7795 | 1/1978 |
| JP | 61-145255 A | 7/1986 |
| JP | 7-130919 A | 5/1995 |
| JP | 8-20673 A | 1/1996 |
| JP | 10-279669 A | 10/1998 |
| JP | 11-255868 A | 9/1999 |
| JP | 2009-242480 A | 10/2009 |
| WO | WO 2010/013406 A1 | 2/2010 |

* cited by examiner

RESIN COMPOSITION FOR ENCAPSULATING SEMICONDUCTOR AND SEMICONDUCTOR DEVICE

TECHNICAL FIELD

The present invention relates to a resin composition for encapsulating a semiconductor and a semiconductor device.

BACKGROUND ART

The requirements for decreasing size, decreasing weight and increasing performance of electronic devices have been advanced, the degree of integration and density of semiconductor elements (hereinafter also referred to as the element or chip) is increasing year by year, and surface mounting of semiconductor devices (hereinafter also referred to as the package) has also become widespread. With the progress of related technologies of such semiconductor devices, the requirements for a resin composition for encapsulating a semiconductor element have become more severe as well. For example, in a surface mounting process, when a semiconductor device that has absorbed moisture is exposed to a high-temperature atmosphere during a soldering process, cracks are formed, or detachment occurs inside the semiconductor device due to explosive stress of rapidly vaporized steam, and the operation reliability of the semiconductor device is significantly impaired. Furthermore, with the elimination of use of lead, lead-free solder, which has a melting point higher than conventional solder, is used instead. In the case where such lead-free solder is used, it is necessary to increase the temperature during semiconductor mounting by about 20 degrees centigrade as compared with the case where conventional solder is used, and the stress during the aforementioned soldering process becomes more severe. With the spread of the surface mounting technology and use of the lead-free solder, solder resistance in a resin composition for encapsulating a semiconductor becomes one of important technical objects.

Against the background of recent environmental problems, there is a growing social need to eliminate the use of a flame retardant such as a brominated epoxy resin, an antimony oxide or the like, which has been used in the past, and the technology for imparting flame retardance equivalent to the conventional flame retardance has become necessary without the use of these flame retardants. As an alternative flame retardant technology, there has been proposed, for example, a method of adopting a crystalline epoxy resin having a lower viscosity and mixing a larger amount of inorganic filler (for example, see Patent Documents 1 and 2). However, it is hard to mention that solder resistance and flame retardance are sufficient by the method.

Furthermore, in recent years, there has appeared a package having a structure obtained by laminating chips inside one package, or a semiconductor device with a wire diameter thinner than the conventional semiconductor device. Since the thickness of the resin-encapsulated portion in such a semiconductor device is thinned than the conventional semiconductor device, there is the risk of lowering the yield rate in an encapsulating process such that insufficient filling easily occurs, or wire sweep easily occurs during molding. In order to improve flow properties of the resin composition, the use of an epoxy resin or a phenol resin curing agent having a low molecular weight is easily considered, but according to this method, there are defects such that defective transferor stoppage of an equipment (deterioration of handling property) easily occurs during the molding process due to adhesion of the resin composition (tablets), or properties of solder resistance, flame resistance and moldability are impaired due to deteriorated curability in some cases. As described above, it becomes an important object for the resin composition to balance flowability, handling property, solder resistance, flame resistance and moldability due to fine wiring and thinning of a semiconductor device.

RELATED DOCUMENT

Patent Document 1: Japanese Laid-Open Patent Publication No. 1995-130919
Patent Document 2: Japanese Laid-Open Patent Publication No. 1996-20673

DISCLOSURE OF THE INVENTION

An object of the present invention is to economically provide a resin composition for encapsulating a semiconductor excellent in a balance among flowability, handling property, solder resistance, flame resistance and continuous molding property, and a semiconductor device excellent in the reliability and obtained by encapsulating a semiconductor element with a cured product of the resin composition.

The resin composition for encapsulating a semiconductor of the present invention includes a phenol resin (A) having one or more components containing a component (A1) composed of a polymer having a structural unit represented by the following general formula (1) and a structural unit represented by the following general formula (2), an epoxy resin (B), and an inorganic filler (C),

[Chemical Formula 1]

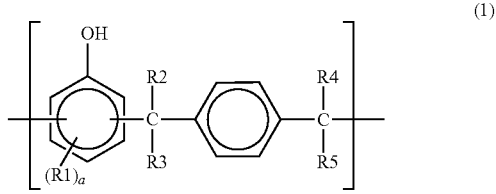

wherein, in the above general formula (1), R1 is each independently a hydrocarbon group having 1 to 6 carbon atoms; a is an integer of 0 to 3; and R2, R3, R4 and R5 are each independently a hydrogen atom or a hydrocarbon group having 1 to 6 carbon atoms,

[Chemical Formula 2]

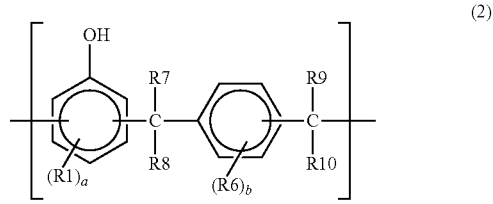

wherein, in the above general formula (2), R1 is each independently a hydrocarbon group having 1 to 6 carbon atoms; a is an integer of 0 to 3; R6 is each independently a hydrocarbon group having 1 to 6 carbon atoms; b is an integer of 1 to 4; and R7, R8, R9 and R10 are each independently a hydrogen atom or a hydrocarbon group having 1 to 6 carbon atoms.

Furthermore, in the resin composition for encapsulating a semiconductor of the present invention, the component (A1) is composed of one or more polymers, and in the measurement by the field desorption mass spectrometry, the total relative intensity of polymers corresponding to the component (A1) is equal to or more than 10% and equal to or less than 80%, based on the total relative intensity of the phenol resin (A).

In the resin composition for encapsulating a semiconductor of the present invention, the phenol resin (A) further includes a component (A2) composed of a polymer having the structural unit represented by the general formula (1) but without having the structural unit represented by the general formula (2).

In the resin composition for encapsulating a semiconductor of the present invention, the phenol resin (A) further includes a component (A3) composed of a polymer having the structural unit represented by said general formula (2) but without having the structural unit represented by said general formula (1).

In the resin composition for encapsulating a semiconductor of the present invention, the ratio of the total number of structural units represented by the general formula (1) to the total number of structural units represented by the general formula (2) is from 30/70 to 95/5, based on the total phenol resin (A).

In the resin composition for encapsulating a semiconductor of the present invention, in the structural unit represented by the general formula (2), R6 is a methyl group, and b is from 1 to 3.

In the resin composition for encapsulating a semiconductor of the present invention, the ICI viscosity at 150 degrees centigrade of the phenol resin (A) is equal to or less than 1.5 dPa·s.

In the resin composition for encapsulating a semiconductor of the present invention, the softening point of the phenol resin (A) is equal to or more than 63 degrees centigrade and equal to or less than 85 degrees centigrade.

In the resin composition for encapsulating a semiconductor of the present invention, the area ratio of binuclear components in the phenol resin (A) is equal to or less than 20% according to the gel permeation chromatography (GPC) method in terms of standard polystyrene.

In the resin composition for encapsulating a semiconductor of the present invention, the phenol resin (A) is contained in an amount of equal to or more than 20% by mass and equal to or less than 100% by mass, based on the total curing agent.

In the resin composition for encapsulating a semiconductor of the present invention, the epoxy resin (B) is at least one epoxy resin selected from the group consisting of a biphenyl type epoxy resin, a bisphenol type epoxy resin, a stilbene type epoxy resin, an anthracenediol type epoxy resin, a phenol novolac type epoxy resin, a cresol novolac type epoxy resin, a triphenol methane type epoxy resin, an alkyl-modified triphenol methane type epoxy resin, a phenol aralkyl type epoxy resin having a phenylene skeleton, a phenol aralkyl type epoxy resin having a biphenylene skeleton, a naphthol aralkyl type epoxy resin having a phenylene skeleton, a dihydroxy naphthalene type epoxy resin, an epoxy resin obtained by glycidyl etherification of dimers of dihydroxy naphthalene, a novolac type epoxy resin having a methoxynaphthalene skeleton, triglycidyl isocyanurate, monoallyl diglycidyl isocyanurate and a dicyclopentadiene-modified phenol type epoxy resin.

In the resin composition for encapsulating a semiconductor of the present invention, the content of the inorganic filler (C) is equal to or more than 80% by mass and equal to or less than 93% by mass.

The resin composition for encapsulating a semiconductor of the present invention further contains a curing accelerator (D).

In the resin composition for encapsulating a semiconductor of the present invention, the curing accelerator (D) contains at least one curing accelerator selected from the group consisting of a tetra-substituted phosphonium compound, a phosphobetaine compound, an adduct of a phosphine compound and a quinone compound, and an adduct of a phosphonium compound and a silane compound.

The resin composition for encapsulating a semiconductor of the present invention further contains a compound (E) in which a hydroxyl group is bonded to each of two or more adjacent carbon atoms constituting an aromatic ring.

The resin composition for encapsulating a semiconductor of the present invention further contains a coupling agent (F).

In the resin composition for encapsulating a semiconductor of the present invention, the coupling agent (F) contains a silane coupling agent having a secondary amino group.

The resin composition for encapsulating a semiconductor of the present invention further contains an inorganic flame retardant (G).

In the resin composition for encapsulating a semiconductor of the present invention, the inorganic flame retardant (G) contains metal hydroxide or complex metal hydroxide.

The semiconductor device of the present invention is obtained by encapsulating a semiconductor element with a cured product of the above-stated resin composition for encapsulating a semiconductor.

In the meantime, any combination of the above-described components, or conversion of the expression of the present invention between methods, devices and the like is also effective as an aspect of the invention.

Effect of the Invention

According to the present invention, it is possible to economically obtain a resin composition for encapsulating a semiconductor excellent in a balance among handling property, solder resistance, flame resistance and continuous molding property while improving higher flowability than the resin composition of the related art, and a semiconductor device excellent in the reliability and obtained by encapsulating a semiconductor element with a cured product of the resin composition.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF EMBODIMENTS

Figure 1:
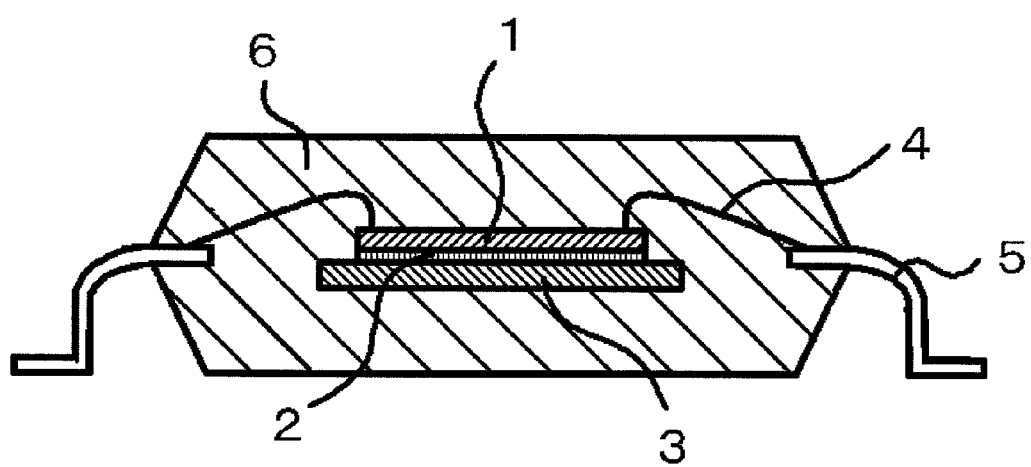
FIG. 1 is a view illustrating a cross-section structure of an example of a semiconductor device using a resin composition for encapsulating a semiconductor according to the present invention.

The resin composition for encapsulating a semiconductor of the present invention includes a phenol resin (A) having one or more components containing a component (A1) composed of a polymer having a structural unit represented by the general formula (1) and a structural unit represented by the general formula (2); an epoxy resin (B); and an inorganic filler (C). Accordingly, it is possible to obtain a resin composition for encapsulating a semiconductor excellent in a balance among handling property, solder resistance, flame resistance and continuous molding property while improving higher flowability than the resin composition of the related art. Also, the semiconductor device of the present invention is obtained by encapsulating a semiconductor element with a cured product of the aforementioned resin composition for encapsulating a semiconductor. Accordingly, a semiconductor device excellent in the reliability can be economically obtained. Hereinafter, the present invention will be described in detail.

First, the resin composition for encapsulating a semiconductor will be described. In the resin composition for encapsulating a semiconductor of the present invention, as the epoxy resin curing agent, there is used a phenol resin (A) having one or more components containing a component (A1) composed of a polymer having a structural unit represented by the following general formula (1) and a structural unit represented by the following general formula (2).

[Chemical Formula 3]

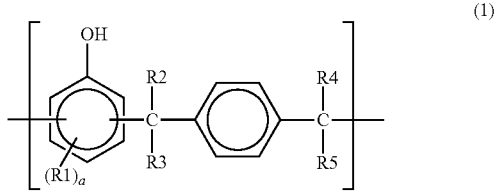

(1)

In the general formula (1), R1 is each independently a hydrocarbon group having 1 to 6 carbon atoms; a is an integer of 0 to 3; and R2, R3, R4 and R5 are each independently a hydrogen atom or a hydrocarbon group having 1 to 6 carbon atoms.

[Chemical Formula 4]

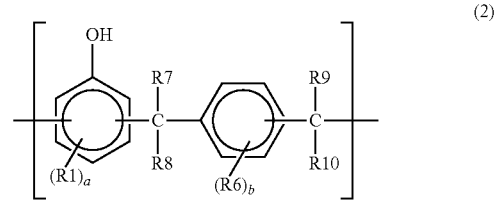

(2)

In the general formula (2), R1 is each independently a hydrocarbon group having 1 to 6 carbon atoms; a is an integer of 0 to 3; R6 is each independently a hydrocarbon group having 1 to 6 carbon atoms; b is an integer of 1 to 4; and R7, R8, R9 and R10 are each independently a hydrogen atom or a hydrocarbon group having 1 to 6 carbon atoms. In the structural unit represented by the general formula (2), R6 is preferably a methyl group, and b is preferably from 1 to 3.

The component (A1) contained in the phenol resin (A) may exhibit excellent curability and solder resistance by having a skeleton structure similar to the phenol aralkyl type phenol resin having a phenylene skeleton, and may further exhibit excellent moisture resistance because the substituent R6 of the structural unit represented by the general formula (2) is hydrophobic. Furthermore, the component (A1) contained in the phenol resin (A) also has properties such that adhesion hardly takes place and excellent handling property is exhibited, as compared to the phenol aralkyl resin having a phenylene skeleton having a substantially equal molecular weight. The detailed reason why adhesion hardly takes place is not clear, but it is considered because an intermolecular force (van der Waals force) is locally strong and accordingly the movement of molecules is constrained by partly containing the substituent R6 and as a result, the softening point is relatively increased. The resin composition using the phenol resin (A) may exhibit excellent flowability and curability without damaging handling property, and the cured product thereof has properties such as excellent flame resistance, a low moisture absorption coefficient and improved soldering crack resistance.

The phenol resin (A) contains the component (A1) composed of a polymer containing the structural unit represented by the general formula (1) and the structural unit represented by the general formula (2), but it may further contain a component (A2) composed of a polymer having the structural unit represented by the general formula (1) but without having the structural unit represented by the general formula (2), or a component (A3) composed of a polymer having the structural unit represented by the general formula (2) but without having the structural unit represented by the general formula (1). The ratio of the total number of structural units represented by the general formula (1) to the total number of structural units represented by the general formula (2) is preferably from 30/70 to 95/5, more preferably from 40/60 to 90/10, and particularly preferably from 50/50 to 85/15, based on the total phenol resin (A). Here, "to" in the specification includes both upper and lower numbers. When the average ratio of the total numbers of both structural units is within the above range, a resin composition for encapsulating a semiconductor excellent in a balance among flame resistance, handling property, continuous molding property and solder resistance can be obtained. Furthermore, the ratio of the total number of structural units represented by the general formula (1) to the total number of structural units represented by the general formula (2), based on the total phenol resin (A), may be obtained by the field desorption mass spectrometry (FD-MS) measurement. With respect to respective peaks detected by the FD-MS analysis and measured in the detected mass (m/z) range of 50 to 2,000, the molecular weight and the repeated number may be obtained from the detected mass (m/z), and the intensity ratio of respective peaks is further arithmetically computed as the content ratio (mass), whereby the content ratio of respective structural units of the general formulae (1) and (2) may be obtained.

Here, in the resin composition for encapsulating a semiconductor of the present invention, the component (A1) is composed of one or more polymers, and in the measurement by the field desorption mass spectrometry, the total relative intensity of polymers corresponding to the component (A1) is preferably equal to or more than 10% and equal to or less than 80%, more preferably equal to or more than 10% and equal to or less than 60%, and further preferably equal to or more than 10% and equal to or less than 40%, based on the total relative intensity of the phenol resin (A). When the total relative intensity of polymers corresponding to the component (A1) is within the above range, a resin composition for encapsulating a semiconductor excellent in a balance between curability and solder resistance can be obtained.

Meanwhile, the ICI viscosity at 150 degrees centigrade of the phenol resin (A) is preferably equal to or more than 0.1 dPa·s and equal to or less than 1.5 dPa·s, and more preferably equal to or more than 0.3 dPa·s and equal to or less than 0.7 dPa·s. When the ICI viscosity at 150 degrees centigrade of the phenol resin (A) is within the above range, a resin composition for encapsulating a semiconductor excellent in filling property is obtained.

The softening point of the phenol resin (A) is preferably equal to or more than 63 degrees centigrade and equal to or less than 85 degrees centigrade, and more preferably equal to or more than 64 degrees centigrade and equal to or less than 80 degrees centigrade. When the softening point of the phenol resin (A) is within the above range, a resin composition for encapsulating a semiconductor excellent in flame resistance and handling property is obtained.

The polymerization method of the phenol resin (A) is not particularly limited, and examples thereof include a method of obtaining a phenol resin by co-polycondensation of a phenol compound, a compound represented by the following general formula (3) and a compound represented by the following general formula (4) (hereinafter also referred to as the first production method), a method of obtaining a phenol resin by copolymerization with the addition of a compound represented by the following general formula (3) and a phenol compound after reacting an alkyl-substituted aromatic compound represented by the following general formula (5) with an aldehyde (hereinafter also referred to as the second production method) and the like. These polymerization methods may be properly used in combination. Among these, preferably used is the second production method because raw materials are available at low cost.

[Chemical Formula 5]

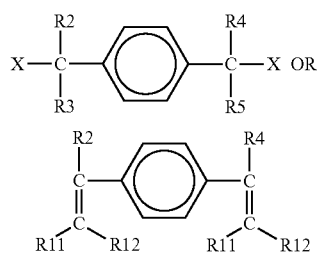

(3)

In the general formula (3), R2, R3, R4 and R5 are each independently a hydrogen atom or a hydrocarbon group having 1 to 6 carbon atoms; X is a halogen atom, a hydroxyl group or an alkoxy group having 1 to 6 carbon atoms; and R11 and R12 are each independently a hydrocarbon group having 1 to 5 carbon atoms or a hydrogen atom,

[Chemical Formula 6]

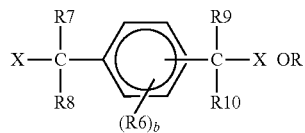

(4)

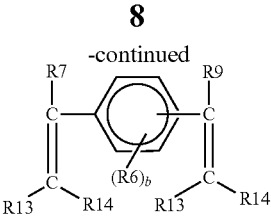

-continued

In the general formula (4), R6 is each independently a hydrocarbon group having 1 to 6 carbon atoms; b is an integer of 1 to 4; R7, R8, R9 and are each independently a hydrogen atom or a hydrocarbon group having 1 to 6 carbon atoms; X is a halogen atom, a hydroxyl group or an alkoxy group having 1 to 6 carbon atoms; and R13 and R14 are each independently a hydrocarbon group having 1 to 5 carbon atoms or a hydrogen atom.

[Chemical Formula 7]

(5)

In the general formula (5), R6 is each independently a hydrocarbon group having 1 to 6 carbon atoms; and b is an integer of 1 to 4.

Examples of the phenol compound used for the production of the phenol resin (A) include phenol, o-cresol, p-cresol, m-cresol, phenylphenol, ethylphenol, n-propylphenol, isopropylphenol, t-butylphenol, xylenol, methylpropylphenol, methylbutylphenol, dipropylphenol, dibutylphenol, nonylphenol, mesitol, 2,3,5-trimethylphenol, 2,3,6-trimethylphenol and the like, but are not restricted thereto. Among these compounds, preferably used are phenol and o-cresol, and more preferably used is phenol from the viewpoint of reactivity with the epoxy resin. In the production of the phenol resin (A), these phenol compounds may be used singly or may be used in combination of two or more kinds.

In R2, R3, R4 and R5 of the compound represented by the general formula (3) used for the production of the phenol resin (A), examples of the hydrocarbon group having 1 to 6 carbon atoms include a methyl group, an ethyl group, a propyl group, an n-butyl group, an isobutyl group, a t-butyl group, an n-pentyl group, a 2-methylbutyl group, a 3-methylbutyl group, a t-pentyl group, an n-hexyl group, a 1-methylpentyl group, a 2-methylpentyl group, a 3-methylpentyl group, a 4-methylpentyl group, a 2,2-dimethylbutyl group, a 2,3-dimethylbutyl group, a 2,4-dimethylbutyl group, a 3,3-dimethylbutyl group, a 3,4-dimethylbutyl group, a 4,4-dimethylbutyl group, a 2-ethylbutyl group, a 1-ethylbutyl group, a cyclohexyl group, a phenyl group and the like.

Examples of =CR11R12 (alkylidene group) of the compound represented by the general formula (3) used for the production of the phenol resin (A) include a methylidene group, an ethylidene group, a propylidene group, an n-butylidene group, an isobutylidene group, a t-butylidene group, an n-pentylidene group, a 2-methylbutylidene group, a 3-methylbutylidene group, a t-pentylidene group, an n-hexylidene group, a 1-methylpentylidene group, a 2-methylpentylidene group, a 3-methylpentylidene group, a 4-methylpentylidene group, a 2,2-dimethylbutylidene group, a 2,3-dimethylbutylidene group, a 2,4-dimethylbutylidene group, a 3,3-dimethylbutylidene group, a 3,4-dimethylbutylidene group, a 4,4- dimethylbutylidene group, a 2-ethylbutylidene group, a 1-ethylbutylidene group, a cyclohexylidene group and the like.

In X of the compound represented by the general formula (3) used for the production of the phenol resin (A), examples of the halogen atom include a fluorine atom, a chlorine atom, a bromine atom, an iodine atom and the like. In X of the compound represented by the general formula (3) used for the production of the phenol resin (A), examples of the alkoxy group having 1 to 6 carbon atoms include a methoxy group, an ethoxy group, a propoxy group, an n-butoxy group, an isobutoxy group, a t-butoxy group, an n-pentoxy group, a 2-methylbutoxy group, a 3-methylbutoxy group, a t-pentoxy group, an n-hexoxy group, a 1-methylpentoxy group, a 2-methylpentoxy group, a 3-methylpentoxy group, a 4-methylpentoxy group, a 2,2-dimethylbutoxy group, a 2,3-dimethylbutoxy group, a 2,4-dimethylbutoxy group, a 3,3-dimethylbutoxy group, a 3,4-dimethylbutoxy group, a 4,4-dimethylbutoxy group, a 2-ethylbutoxy group, a 1-ethylbutoxy group and the like.

In the production of the phenol resin (A), the compounds represented by the general formula (3) may be used singly or may be used in combination of two or more kinds. Among these compounds, p-xylylene glycol can be synthesized at a relatively low temperature, and removal and handling of a reaction by-product are easy, so that such compounds are preferred. When X is a halogen atom, hydrogen halide caused by the presence of a small amount of moisture may be used as an acidic catalyst.

In $R_7$, $R_8$, $R_9$, $R_{10}$ and $R_6$ of the compound represented by the general formula (4) used for the production of the phenol resin (A), examples of the hydrocarbon group having 1 to 6 carbon atoms include a methyl group, an ethyl group, a propyl group, an n-butyl group, an isobutyl group, a t-butyl group, an n-pentyl group, a 2-methylbutyl group, a 3-methylbutyl group, a t-pentyl group, an n-hexyl group, a 1-methylpentyl group, a 2-methylpentyl group, a 3-methylpentyl group, a 4-methylpentyl group, a 2,2-dimethylbutyl group, a 2,3-dimethylbutyl group, a 2,4-dimethylbutyl group, a 3,3-dimethylbutyl group, a 3,4-dimethylbutyl group, a 4,4-dimethylbutyl group, a 2-ethylbutyl group, a 1-ethylbutyl group, a cyclohexyl group, a phenyl group and the like.

Examples of $=CR_{13}R_{14}$ (alkylidene group) of the compound represented by the general formula (4) used for the production of the phenol resin (A) include a methylidene group, an ethylidene group, a propylidene group, an n-butylidene group, an isobutylidene group, a t-butylidene group, an n-pentylidene group, a 2-methylbutylidene group, a 3-methylbutylidene group, a t-pentylidene group, an n-hexylidene group, a 1-methylpentylidene group, a 2-methylpentylidene group, a 3-methylpentylidene group, a 4-methylpentylidene group, a 2,2-dimethylbutylidene group, a 2,3-dimethylbutylidene group, a 2,4-dimethylbutylidene group, a 3,3-dimethylbutylidene group, a 3,4-dimethylbutylidene group, a 4,4-dimethylbutylidene group, a 2-ethylbutylidene group, a 1-ethylbutylidene group, a cyclohexylidene group and the like.

In X of the compound represented by the general formula (4) used for the production of the phenol resin (A), examples of the halogen atom include a fluorine atom, a chlorine atom, a bromine atom, an iodine atom and the like. Examples of the alkoxy group having 1 to 6 carbon atoms include a methoxy group, an ethoxy group, a propoxy group, an n-butoxy group, an isobutoxy group, a t-butoxy group, an n-pentoxy group, a 2-methylbutoxy group, a 3-methylbutoxy group, a t-pentoxy group, an n-hexoxy group, a 1-methylpentoxy group, a 2-methylpentoxy group, a 3-methylpentoxy group, a 4-methylpentoxy group, a 2,2-dimethylbutoxy group, a 2,3-dimethylbutoxy group, a 2,4-dimethylbutoxy group, a 3,3-dimethylbutoxy group, a 3,4-dimethylbutoxy group, a 4,4-dimethylbutoxy group, a 2-ethylbutoxy group, a 1-ethylbutoxy group and the like.

In the production of the phenol resin (A), the compounds represented by the general formula (4) may be used singly or may be used in combination of two or more kinds. Among these compounds, it is preferable that $R_6$ is a methyl group, and b is from 1 to 3 from the viewpoint of a balance between flame resistance and moisture resistance of a resin composition. When X is methoxy, removal and handling of a reaction by-product are easy, so that such compounds are preferred. When X is a halogen atom, hydrogen halide caused by the presence of a small amount of moisture may be used as an acidic catalyst.

In $R_6$ of the compound represented by the general formula (5) used for the production of the phenol resin (A), examples of the hydrocarbon group having 1 to 6 carbon atoms include a methyl group, an ethyl group, a propyl group, an n-butyl group, an isobutyl group, a t-butyl group, an n-pentyl group, a 2-methylbutyl group, a 3-methylbutyl group, a t-pentyl group, an n-hexyl group, a 1-methylpentyl group, a 2-methylpentyl group, a 3-methylpentyl group, a 4-methylpentyl group, a 2,2-dimethylbutyl group, a 2,3-dimethylbutyl group, a 2,4-dimethylbutyl group, a 3,3-dimethylbutyl group, a 3,4-dimethylbutyl group, a 4,4-dimethylbutyl group, a 2-ethylbutyl group, a 1-ethylbutyl group, a cyclohexyl group, a phenyl group and the like. Examples of the alkyl-substituted aromatic compound include toluene, o-xylene, m-xylene, p-xylene, 1,3,5-trimethylbenzene, 1,2,3-trimethylbenzene, 1,2,4-trimethylbenzene, ethylbenzene, o-diethylbenzene, m-diethylbenzene, p-diethylbenzene, 1,3,5-triethylbenzene, 1,2,3-triethylbenzene, n-1,2,4-triethylbenzene, cumene, o-cymene, m-cymene, p-cymene, n-butylbenzene, sec-butylbenzene, tert-butylbenzene, pentylbenzene, dipentylbenzene and the like. Among these compounds, preferably used are toluene, dimethylbenzene, trimethylbenzene and tetramethylbenzene from the viewpoints of raw material costs and a balance between flame resistance and moisture resistance of a resin composition. In the production of the phenol resin (A), the compounds represented by the general formula (5) may be used singly or may be used in combination of two or more kinds.

Examples of aldehyde used for the production of the phenol resin (A) include formaldehyde, paraformaldehyde, acetaldehyde, benzaldehyde and the like. Among these compounds, preferably used are formaldehyde and paraformaldehyde from the viewpoints of curability of a resin composition and raw material costs.

A method for synthesizing the phenol resin (A) is not particularly limited. For example, in case of the first production method, 0.1 to 0.6 mole of the total amount of the compound represented by the general formula (3) and the compound represented by the general formula (4), 0.005 to 0.05 mole of an acidic catalyst such as formic acid, oxalic acid, p-toluenesulfonic acid, methanesulfonic acid, hydrochloric acid, sulfuric acid, phosphoric acid, acetic acid, Lewis acid or the like, based on 1 mole of the phenol compound, are reacted at a temperature of 50 to 200 degrees centigrade for 2 to 20 hours, while discharging generated gas and moisture out of the system by nitrogen flow, and monomers remained after completion of the reaction may be distilled off by a method such as vacuum distillation, steam distillation or the like. Incidentally, the ratio of the total number of structural units represented by the general formula (1) to the total number of structural units represented by the general formula (2) almost reflects the ratio of the raw materials in use based on the total phenol resin (A). The preferable range of the mixing ratio of the compound represented by the general formula (3) to the compound represented by the general formula (4) is from 20:80 to 80:20 in terms of the molar ratio.

The phenol resin (A) obtained by the first production method is represented by the following general formula (6), and is a mixture of polymers in which m is preferably an integer of 0 to 20 and n is preferably an integer of 0 to 20.

[Chemical Formula 8]

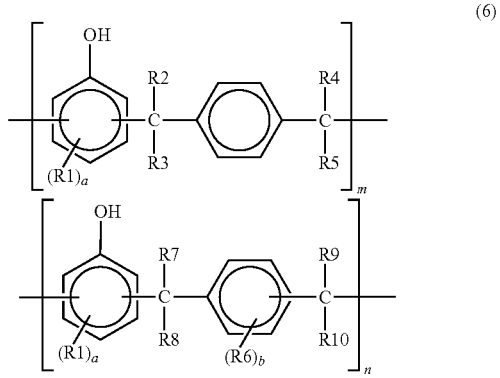

(6)

In the formula, R1 is each independently a hydrocarbon group having 1 to 6 carbon atoms; a is an integer of 0 to 3; R6 is each independently a hydrocarbon group having 1 to 6 carbon atoms; b is an integer of 1 to 4; and R2, R3, R4, R5, R7, R8, R9 and R10 are each independently a hydrogen atom or a hydrocarbon group having 1 to 6 carbon atoms. The end of the molecule is a hydrogen atom or a substituted or unsubstituted hydroxyphenyl group. R2, R3, R4 and R5 in the general formula (6) are the same as those defined in the general formula (3), while R7, R8, R9 and R10 in the general formula (6) are the same as those defined in the general formula (4).

In the mixture of polymers in which it is represented by the general formula (6), m is preferably an integer of 0 to 20, and n is preferably an integer of 0 to 20, when the values of m and n are expressed in terms of the mean value, the mean value of m is more preferably from 1 to 7, and further preferably from 1.2 to 2.5, and the mean value of n is more preferably from 0.2 to 2, and further preferably from 0.4 to 1. When the mean value of m is equal to or more than the above lower limit, deterioration of handling property of the obtained resin composition and curability of the obtained resin composition is suppressed. When the mean value of m is equal to or less than the above upper limit, the viscosity of the phenol resin itself is high, so that deterioration of flowability of the obtained resin composition is suppressed. When the mean value of n is equal to or more than the above lower limit, deterioration of solder resistance and conveyance performance of the resin composition is suppressed. When the mean value of n is equal to or less than the above upper limit, deterioration of flowability and curability of the resin composition, and deterioration of moldability are suppressed. Incidentally, the values of m and n may be obtained by the FD-MS analysis. The molecular weight of the compound of the general formula (6) measured by the FD-MS analysis is preferably equal to or more than 300 and equal to or less than 1,500, and more preferably equal to or more than 500 and equal to or less than 900. In consideration of easy handling property of the phenol resin (A) itself, and a balance among flowability, curability, flame resistance and solder resistance as the resin composition, the amount of the component (A1) composed of a polymer containing the structural unit represented by the general formula (1) and the structural unit represented by the general formula (2) is preferably equal to or more than 5% by mass and equal to or less than 80% by mass, more preferably equal to or more than 8% by mass and equal to or less than 70% by mass, and particularly preferably equal to or more than 11% by mass and equal to or less than 50% by mass, based on the total phenol resin (A) obtained by the first production method.

As a method of adjusting the component (A1) contained in the phenol resin (A) obtained by the first production method, for example, the content of the component (A1) may be increased by adopting a method including increasing the mixing amount of the compound represented by the general formula (4), or a method including gradually adding the compound represented by the general formula (3) to the reaction system.

Among the methods for synthesizing the phenol resin (A), in case of the second production method, for example, aldehyde is added in an amount of 1 to 2.5 mole, and an alkali metal catalyst such as sodium hydroxide, potassium hydroxide or the like, or a strong acid such as para-toluenesulfonic acid, xylenesulfonic acid, sulfuric acid or the like is added as a catalyst in an amount of 0.1 to 2.5 mole, based on 1 mole of the alkyl-substituted aromatic compound represented by the general formula (5). In case of the alkali metal catalyst, the mixture is reacted at a temperature of 5 to 80 degrees centigrade, and in case of the acidic catalyst, the mixture is reacted at a temperature of 100 to 150 degrees centigrade for 0.5 to 5 hours to obtain a reaction intermediate. Subsequently, the compound represented by the general formula (3) is added in an amount of 0.2 to 5 mole, a phenol compound is added in an amount of 1 to 20 mole, and an acidic catalyst such as oxalic acid, p-toluenesulfonic acid, methanesulfonic acid, hydrochloric acid, sulfuric acid, phosphoric acid, acetic acid, Lewis acid or the like is added in an amount of 0.005 to 0.05 mole. The mixture is subjected to a cocondensation reaction at a temperature of 50 to 200 degrees centigrade for 2 to 20 hours while discharging generated gas out of the system by nitrogen flow, and monomers and moisture remained after completion of the reaction may be distilled off by a method such as vacuum distillation, steam distillation or the like. When X in the general formula (3) is a halogen atom, hydrogen halide caused by the presence of a small amount of moisture may be used as an acidic catalyst.

The phenol resin (A) obtained by the second production method is represented by the following general formula (7), and is a mixture of polymers in which i is preferably an integer of 0 to 20, j is preferably an integer of 0 to 20, and k is preferably an integer of 0 to 20.

[Chemical Formula 9]

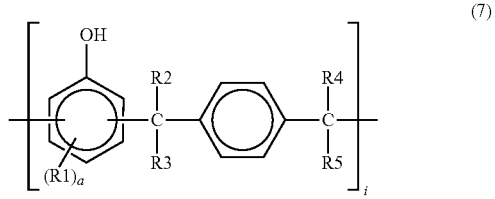

(7)

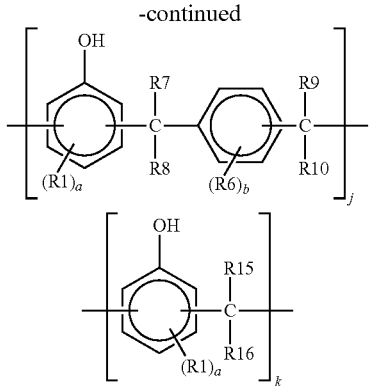

In the general formula, R1 is each independently a hydrocarbon group having 1 to 6 carbon atoms; a is an integer of 0 to 3; R6 is each independently a hydrocarbon group having 1 to 6 carbon atoms; b is an integer of 1 to 4; and R2, R3, R4, R5, R7, R8, R9, R10, R15 and R16 are each independently a hydrogen atom or a hydrocarbon group having 1 to 6 carbon atoms. The end of the molecule is hydrogen atom, substituted or unsubstituted hydroxyphenyl groups or a phenyl group in which 1 to 4 of hydrogen atoms are placed in hydrocarbon groups having 1 to 6 carbon atoms. R2, R3, R4 and R5 in the general formula (7) are the same as those defined in the general formula (3), while R7, R8, R9 and R10 in the general formula (7) are the same as those defined in the general formula (4). Examples of the hydrocarbon group having 1 to 6 carbon atoms in R15 and R16 of the general formula (7) are the same as those of R2 in the general formula (3).

In the mixture of polymers in which it is represented by the general formula (7), i is preferably an integer of 0 to 20, j is preferably an integer of 0 to 20, and k is preferably an integer of 0 to 20, when the values of i, j and k are expressed in terms of the mean value, the mean value of i is more preferably from 0.5 to 7, and further preferably from 1 to 4, the mean value of j is more preferably from 0.2 to 3, and further preferably from 0.4 to 2, and the mean value of k is more preferably from 0 to 5, and further preferably from 0 to 3. When i is equal to or more than the above lower limit, deterioration of curability of the obtained resin composition is suppressed. When i is equal to or less than the above upper limit, the viscosity of the phenol resin itself is high, so that deterioration of flowability of the obtained resin composition is suppressed. When j is equal to or more than the above lower limit, the obtained phenol resin is hardly adhered, and deterioration of soldering crack resistance of the obtained resin composition is suppressed. When j is equal to or less than the above upper limit, deterioration of flowability and curability of the resin composition is suppressed. Furthermore, when k is equal to or more than the above lower limit, deterioration of curability is suppressed. When k is equal to or less than the above upper limit, deterioration of flame resistance of the resin composition is suppressed. Incidentally, the values of i, j and k may be obtained by the FD-MS analysis. The molecular weight of the compound of the general formula (7) measured by the FD-MS analysis is preferably equal to or more than 350 and equal to or less than 1,200, and more preferably equal to or more than 400 and equal to or less than 900. In consideration of easy handling property of the phenol resin (A) itself, and a balance among flowability, curability, flame resistance and solder resistance as the resin composition, the amount of the component (A1) composed of a polymer containing the structural unit represented by the general formula (1) and the structural unit represented by the general formula (2) is preferably equal to or more than 5% by mass and equal to or less than 80% by mass, more preferably equal to or more than 8% by mass and equal to or less than 70% by mass, and particularly preferably equal to or more than 11% by mass and equal to or less than 50% by mass, based on the total phenol resin (A) obtained by the second production method.

Here, as a method of increasing the content of the component (A1) composed of a polymer containing the structural unit represented by the general formula (1) and the structural unit represented by the general formula (2) contained in the phenol resin (A) obtained by the second production method, there is cited, for example, a method including reducing the mixing amount of the compound represented by the general formula (3), or a method including gradually adding it to the reaction system.

The phenol resin (A) obtained by the second production method contains a polymer without having the structural unit represented by the general formula (1) and without having the structural unit represented by the general formula (2) (a component in which, in the general formula (7), i=0 and j=0) as a by-product. However, it may contain these by-products in the ranges in which handling property as the phenol resin (A), and curability, flowability and flame resistance of the resin composition are not impaired. Furthermore, as a method of reducing the content of the above-stated by-products, there are cited a method of reducing the mixing amount of formaldehyde, and a method of removing unreacted aldehyde remained in the reaction intermediate by a known method such as recrystallization, pressure reduction or the like.

Binuclear components may be contained in the phenol resin (A) obtained by the second production method in some cases. As for the content thereof, the content (area ratio) obtained by the area method of gel permeation chromatography (GPC) in terms of standard polystyrene is preferably equal to or less than 20%, and more preferably equal to or less than 15%. When the amount of binuclear components is equal to or less than the above upper limit, blocking of the phenol resin is suppressed, and deterioration of curability of the resin composition is suppressed. As a method of reducing the above-mentioned amount of binuclear components, binuclear components may be reduced by increasing the pressure reduction degree or prolonging the processing time during steam distillation or vacuum distillation after the synthesis of the phenol resin.

Herein, in order to obtain the phenol resin with a lower viscosity, there may be used a method for reducing generation of high molecular weight components by increasing the amount of the phenol compound to be mixed, reducing the amount of formaldehyde components, reducing the amount of the acidic catalyst to be mixed, rapidly discharging once produced hydrogen halide gas out of the system by nitrogen flow or the like, lowering the cocondensation temperature, or the like. In this case, the progress of the reaction may also be confirmed by the situation where water, hydrogen halide and alcohol gas by-produced during the reaction of the general formula (3), the general formula (4), the reaction intermediate and phenol come into existence, or by the molecular weight measured according to the gel permeation chromatography method by sampling a product produced during the reaction.

The phenol resin (A) used in the present invention includes a phenol resin having one or more components containing the component (A1) composed of a polymer having the structural unit represented by the general formula (1) and the structural unit represented by the general formula (2). Specifically, the phenol resin (A) may have the following components (1) and (2) as an essential component, and may contain the following components (3) to (6):

(1) a resin having the same structure as the phenol aralkyl resin having a phenylene skeleton, in which a part of the hydrogen atom having a phenylene skeleton is substituted with a hydrocarbon group having 1 to 6 carbon atoms;

(2) a resin having the same structure as the phenol resin obtained by copolymerization of a phenol aralkyl resin having a phenylene skeleton and a phenol novolac type resin, in which a part of the hydrogen atom having a phenylene skeleton is substituted with a hydrocarbon group having 1 to 6 carbon atoms;

(3) a phenol aralkyl resin having a phenylene skeleton;

(4) a phenol novolac type resin;

(5) a phenol resin obtained by copolymerization of a phenol aralkyl resin having a phenylene skeleton and a phenol novolac type resin; and (6) a polymer in which a phenol group obtained by substituting 1 to 4 of hydrocarbon groups having 1 to 6 carbon atoms is boned to the end of the molecule or the substituent of the hydroxyphenyl group of the above phenol resins (1) to (5) directly or via a paraxylylene group.

Because of the presence of the polymer having a plurality of aforementioned structures, the resin composition may be excellent in handling property as adhesion hardly takes place even though it has a viscosity lower than that of the phenol aralkyl resin having a phenylene skeleton, may be excellent in solder resistance and flame resistance without damaging curability, and may also exhibit excellent continuous molding property. In particular, in case of the second production method, a phenol resin can be produced at a low cost, and the raw material cost is cheaper than the phenol aralkyl resin having a phenylene skeleton.

The values of m and n in the general formula (6) and the values of i, j and k in the general formula (7) may be obtained by the FD-MS measurement. With respect to respective peaks detected by the FD-MS analysis and measured in the detected mass (m/z) range of 50 to 2,000, the molecular weight and the values of the repeated number (m, n, i, j, k) may be obtained from the detected mass (m/z), and the intensity ratio of respective peaks is further arithmetically computed as the content ratio (mass), whereby respective mean values of m and n, and respective mean values of i, j and k may be obtained.

When the phenol resin (A) contains a phenol novolac type resin, the content of the phenol novolac type resin contained in the phenol resin (A) is preferably from 5 to 20% by mass, and more preferably from 5 to 15% by mass, based on the total phenol resin (A). When it is within the above range, excellent curability and flame resistance may be achieved.

The mixing amount of the phenol resin (A) in the resin composition for encapsulating a semiconductor of the present invention is preferably equal to or more than 0.5% by mass, more preferably equal to or more than 1% by mass, and further preferably equal to or more than 1.5% by mass, based on the total mass of the resin composition for encapsulating a semiconductor. When the lower limit is within the above range, the obtained resin composition has excellent flowability. The amount of the phenol resin (A) in the resin composition for encapsulating a semiconductor is preferably equal to or less than 10% by mass, more preferably equal to or less than 9% by mass, and further preferably equal to or less than 8% by mass, based on the total mass of the resin composition for encapsulating a semiconductor. When the upper limit is within the above range, the obtained resin composition has excellent solder resistance and curability.

In the resin composition for encapsulating a semiconductor of the present invention, other curing agent may be used together in the ranges in which an effect from the use of the above phenol resin (A) is not damaged. Examples of the curing agent which may be used together include a polyaddition type curing agent, a catalyst type curing agent, a condensation type curing agent and the like. Examples of the polyaddition type curing agent include polyamine compounds containing dicyandiamide (DICY), organic dihydrazide and the like; acid anhydrides containing alicyclic acid anhydride such as hexahydrophthalic anhydride (HHPA), methyl tetrahydrophthalic anhydride (MTHPA) and the like, aromatic acid anhydride such as trimellitic anhydride (TMA), pyromellitic anhydride (PMDA), benzophenonetetracarboxylic acid (BTDA) and the like; polyphenol compounds such as a novolac type phenol resin, a phenol polymer and the like; polymercaptan compounds such as polysulfide, thioester, thioether and the like; isocyanate compounds such as isocyanate prepolymer, blocked isocyanate and the like; and organic acids such as a carboxylic acid-containing polyester resin and the like, in addition to aliphatic polyamines such as diethylenetriamine (DETA), triethylenetetramine (TETA), meta-xylylenediamine (MXDA) and the like, and aromatic polyamines such as diaminodiphenyl methane (DDM), m-phenylene diamine (MPDA), diaminodiphenyl sulfone (DDS) and the like.

Examples of the catalyst type curing agent include tertiary amine compounds such as benzyldimethylamine (BDMA), 2,4,6-trisdimethylaminomethylphenol (DMP-30) and the like; imidazole compounds such as 2-methylimidazole, 2-ethyl-4-methylimidazole (EMI24) and the like; and Lewis acids such as $BF_3$ complex and the like.

Examples of the condensation type curing agent include phenol resin type curing agents such as a novolac type phenol resin, a resol type phenol resin and the like; urea resins such as methylol group-containing urea resins; and melamine resins such as methylol group-containing melamine resins.

Among these, preferably used is a phenol resin type curing agent from the viewpoint of a balance among flame resistance, moisture resistance, electrical properties, curability, storage stability and the like. The phenol resin type curing agent may generally be monomers, oligomers, or polymers having two or more phenolic hydroxyl groups in one molecule. The molecular weight and molecular structure thereof are not particularly restricted, and examples include novolac type resins such as a phenol novolac resin, a cresol novolac resin, a naphthol novolac resin and the like; polyfunctional phenol resins such as a triphenol methane type phenol resin and the like; modified phenol resins such as a terpene-modified phenol resin, a dicyclopentadiene-modified phenol resin and the like; aralkyl type resins such as a phenol aralkyl resin having a phenylene skeleton and/or a biphenylene skeleton, a naphthol aralkyl resin having a phenylene skeleton and/or a biphenylene skeleton and the like; and bisphenol compounds such as bisphenol A, bisphenol F and the like. These compounds may be used singly or may be used in combination of two or more kinds. Among these, the hydroxyl equivalent is preferably equal to or more than 90 g/eq and equal to or less than 250 g/eq from the viewpoint of curability.

When such other curing agents are used together, the lower limit of the mixing ratio of the phenol resin (A) is preferably equal to or more than 20% by mass, more preferably equal to or more than 30% by mass and particularly preferably equal to or more than 50% by mass, based on the total amount of the curing agent. The upper limit of the mixing ratio of the phenol resin (A) is not particularly limited, and for example, it may be equal to or less than 100% by mass, based on the total amount of the curing agent. When the mixing ratio is within the above range, excellent flowability may be exhibited while maintaining flame resistance and solder resistance.

The lower limit of the mixing ratio of the total curing agent is not particularly limited, but it is preferably equal to or more than 0.8% by mass and more preferably equal to or more than 1.5% by mass, based on the total resin composition. When the lower limit of the mixing ratio is within the above range, sufficient flowability may be achieved. On the other hand, the upper limit of the mixing ratio of the total curing agent is not particularly limited, but it is preferably equal to or less than 10% by mass and more preferably equal to or less than 8% by mass, based on the total resin composition. When the upper limit of the mixing ratio is within the above range, excellent solder resistance may be achieved.

Examples of the epoxy resin (B) used for the resin composition for encapsulating a semiconductor of the present invention include crystalline epoxy resins such as a biphenyl type epoxy resin, a bisphenol type epoxy resin, a stilbene type epoxy resin, an anthracenediol type epoxy resin and the like; novolac type epoxy resins such as a phenol novolac type epoxy resin, a cresol novolac type epoxy resin and the like; polyfunctional epoxy resins such as a triphenol methane type epoxy resin, an alkyl-modified triphenol methane type epoxy resin and the like; aralkyl type epoxy resins such as a phenol aralkyl type epoxy resin having a phenylene skeleton, a phenol aralkyl type epoxy resin having a biphenylene skeleton, a naphthol aralkyl type epoxy resin having a phenylene skeleton and the like; naphthol type epoxy resins such as a dihydroxy naphthalene type epoxy resin, an epoxy resin obtained by glycidyl etherification of dimers of dihydroxy naphthalene and the like; novolac type epoxy resins having a methoxynaphthalene skeleton; triazine nucleus-containing epoxy resins such as triglycidyl isocyanurate, monoallyl diglycidyl isocyanurate and the like; and bridged cyclic hydrocarbon compound-modified phenol type epoxy resins such as a dicyclopentadiene-modified phenol type epoxy resin and the like, but are not restricted thereto. In view of moisture-resistant reliability of the resulting resin composition for encapsulating a semiconductor, $Na^+$ ion and $Cl^-$ ion, which are ionic impurities, are preferably not contained in these epoxy resins as much as possible. Also, from the viewpoint of the curability of the resin composition for a semiconductor, the epoxy equivalent of the epoxy resin is preferably equal to or more than 100 g/eq and equal to or less than 500 g/eq.

Among these, in view of flowability, preferably used are a biphenyl type epoxy resin, a bisphenol type epoxy resin and the like. In view of solder resistance, preferably used are a phenol aralkyl type epoxy resin having a phenylene skeleton, a phenol aralkyl type epoxy resin having a biphenylene skeleton, a novolac type epoxy resin having a methoxynaphthalene skeleton and the like. Furthermore, from the viewpoint of low-warping properties in a one-side encapsulated semiconductor device, preferably used are a triphenol methane type epoxy resin, a naphthol aralkyl type epoxy resin having a phenylene skeleton, an anthracenediol type epoxy resin and the like. As shown in Examples to be described below, with the use of such an epoxy resin in combination with the phenol resin (A) of the present invention, there is obtained an operational effect of achieving stably excellent balance among handling property, solder resistance, flame resistance and continuous molding property while improving flowability.

The amount of the epoxy resin (B) in the resin composition for encapsulating a semiconductor is preferably equal to or more than 2% by mass and more preferably equal to or more than 4% by mass, based on the total mass of the resin composition for encapsulating a semiconductor. When the lower limit is within the above range, the obtained resin composition has excellent flowability. On the other hand, the amount of the epoxy resin (B) in the resin composition for encapsulating a semiconductor is preferably equal to or less than 15% by mass and more preferably equal to or less than 13% by mass, based on the total mass of the resin composition for encapsulating a semiconductor. When the upper limit is within the above range, the obtained resin composition has excellent solder resistance.

Incidentally, it is preferable that the phenol resin and the epoxy resin are mixed such that the equivalent ratio (EP)/(OH) of the number of epoxy groups (EP) of the total epoxy resin to the number of phenolic hydroxyl groups (OH) of the total phenol resin is equal to or more than 0.8 and equal to or less than 1.3. When the equivalent ratio is within the above range, sufficient curing properties may be obtained during molding of the obtained resin composition.

As the inorganic filler (C) used for the resin composition for encapsulating a semiconductor of the present invention, inorganic fillers which are generally used in the related field may be used. Examples thereof include fused silica, spherical silica, crystalline silica, alumina, silicon nitride, aluminum nitride and the like. The particle diameter of the inorganic filler is preferably equal to or more than 0.01 µm and equal to or less than 150 µm from the viewpoint of filling property into the mold cavity.

The amount of the inorganic filler (C) contained in the resin composition for encapsulating a semiconductor is preferably equal to or more than 80% by mass, more preferably equal to or more than 83% by mass, and further preferably equal to or more than 86% by mass, based on the total mass of the resin composition for encapsulating a semiconductor. When the lower limit is within the above range, an increase in the amount of moisture absorption during curing of the obtained resin composition and deterioration of strength may be suppressed, and accordingly a cured product having excellent soldering crack resistance may be obtained. Furthermore, the amount of the inorganic filler (C) in the resin composition for encapsulating a semiconductor is preferably equal to or less than 93% by mass, more preferably equal to or less than 91% by mass, and further preferably equal to or less than 90% by mass, based on the total mass of the resin composition for encapsulating a semiconductor. When the upper limit is within the above range, the obtained resin composition has both excellent flowability and excellent moldability.

Incidentally, as described below, when metal hydroxide such as aluminum hydroxide, magnesium hydroxide or the like, or an inorganic flame retardant such as zinc borate, zinc molybdate, antimony trioxide or the like is used, the total amount of the inorganic flame retardant and the above-stated inorganic filler is preferably within the above range.

The resin composition for encapsulating a semiconductor of the present invention may contain a curing accelerator (D). The curing accelerator (D) may be any compound which can accelerate a reaction between an epoxy group in the epoxy resin and a hydroxyl group in the phenol resin, and may be selected from those curing accelerators (D) commonly used. Concrete examples include phosphorous-containing compounds such as organic phosphine, a tetra-substituted phosphonium compound, a phosphobetaine compound, an adduct of a phosphine compound and a quinone compound, an adduct of a phosphonium compound and a silane compound and the like; and nitrogen-containing compounds such as 1,8-diazabicyclo(5,4,0)undecene-7, benzyldimethylamine, 2-methylimidazole and the like. Among these, preferably used are phosphorous-containing compounds in view of curability, and more preferably used are catalysts having latency such as a tetra-substituted phosphonium compound, a phosphobetaine compound, an adduct of a phosphine compound and a quinone compound, an adduct of a phosphonium compound and a silane compound and the like in view of a balance between flowability and curability. In consideration of flowability, particularly preferably used is a tetra-substituted phosphonium compound. In view of solder resistance, particularly preferably used are a phosphobetaine compound, and an adduct of a phosphine compound and a quinone compound. Furthermore, in consideration of the latent curability, particularly preferably used is an adduct of a phosphonium compound and a silane compound. In view of continuous molding property, preferably used is a tetra-substituted phosphonium compound.

Examples of the organic phosphines which may be used for the resin composition for encapsulating a semiconductor of the present invention include primary phosphines such as ethylphosphine, phenylphosphine and the like; secondary phosphines such as dimethylphosphine, diphenylphosphine and the like; and tertiary phosphines such as trimethylphosphine, triethylphosphine, tributylphosphine, triphenylphosphine and the like.

Examples of the tetra-substituted phosphonium compound which may be used for the resin composition for encapsulating a semiconductor of the present invention include compounds represented by the following general formula (8).

[Chemical Formula 10]

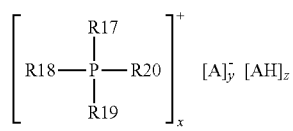

(8)

In the general formula (8), P represents a phosphorus atom; R17, R18, R19 and R20 each independently represent an aromatic group or an alkyl group; A represents an anion of an aromatic organic acid in which at least one functional group selected from a hydroxyl group, a carboxyl group and a thiol group is bonded to an aromatic ring; AH represents an aromatic organic acid in which at least one functional group selected from a hydroxyl group, a carboxyl group and a thiol group is bonded to an aromatic ring; x and y are each an integer of 1 to 3; z is an integer of 0 to 3; and x=y.

The compound represented by the general formula (8) is obtained, for example, in the following manner, but the method is not limited thereto. First, a tetra-substituted phosphonium halide, an aromatic organic acid and a base are added to an organic solvent and uniformly mixed to produce an aromatic organic acid anion in the solution system. Subsequently, water is added to the solution, and thus, the compound represented by the general formula (8) may be precipitated. In the compound represented by the general formula (8), from the viewpoint of being excellent in a balance between the yielding rate and curing acceleration effect at the time of synthesis, R17, R18, R19 and R20 bonded to a phosphorus atom are each preferably a phenyl group, and AH is preferably a compound in which a hydroxyl group is bonded to an aromatic ring, i.e., a phenol compound, and A is preferably an anion of the phenol compound.

Examples of the phosphobetaine compound which may be used for the resin composition for encapsulating a semiconductor of the present invention include compounds represented by the following general formula (9).

[Chemical Formula 11]

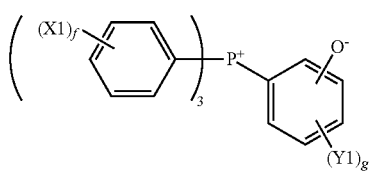

(9)

In the general formula (9), X1 represents an alkyl group having 1 to 3 carbon atoms; Y1 represents a hydroxyl group; f is an integer of 0 to 5; and g is an integer of 0 to 4.

The compound represented by the general formula (9) is obtained, for example, in the following manner. First, it is obtained through a step in which a triaromatic-substituted phosphine, which is a tertiary phosphine, is brought into contact with a diazonium salt to substitute the triaromatic-substituted phosphine and a diazonium group of the diazonium salt. However, the method is not limited thereto.

Examples of the adduct of a phosphine compound and a quinone compound which may be used for the resin composition for encapsulating a semiconductor of the present invention include compounds represented by the following general formula (10).

[Chemical Formula 12]

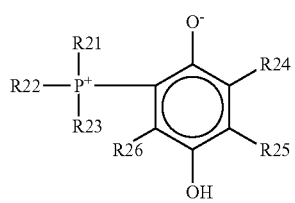

(10)

In the general formula (10), P represents a phosphorus atom; R21, R22 and R23 each independently represent an alkyl group having 1 to 12 carbon atoms or an aryl group having 6 to 12 carbon atoms; R24, R25 and R26 each independently represent a hydrogen atom or a hydrocarbon group having 1 to 12 carbon atoms; and R24 and R25 may be bonded to each other to form a ring.

Preferable examples of the phosphine compound used for the adduct of a phosphine compound and a quinone compound include unsubstituted aromatic ring-containing phosphines such as triphenylphosphine, tris(alkylphenyl)phosphine, tris(alkoxyphenyl)phosphine, trinaphthylphosphine, tris(benzyl)phosphine and the like; and phosphines containing an aromatic ring substituted with an alkyl group or an alkoxy group. Examples of the alkyl group and the alkoxy group include alkyl groups having 1 to 6 carbon atoms and alkoxy groups having 1 to 6 carbon atoms. From the viewpoint of availability, triphenylphosphine is preferred.

Examples of the quinone compound used for the adduct of a phosphine compound and a quinone compound include o-benzoquinone, p-benzoquinone and anthraquinones. Among these, p-benzoquinone is preferred from the viewpoint of storage stability.

As a method for producing an adduct of a phosphine compound and a quinone compound, an organic tertiary phosphine is brought into contact with a benzoquinone in a solvent that can dissolve both the organic tertiary phosphine and the benzoquinone, and mixed to produce an adduct thereof. Any solvent can be used as long as the solubility into the adduct is low. Examples of the solvent include ketones such as acetone and methyl ethyl ketone, but are not limited thereto.

In the compound represented by the general formula (10), R21, R22 and R23, all of which are bonded to a phosphorus atom, are each a phenyl group, and R24, R25 and R26 are each a hydrogen atom. That is, a compound to which adding 1,4-benzoquinone and triphenylphosphine is preferable because the compound decreases the elastic modulus during heating of a cured product of the resin composition.

Examples of the adduct of a phosphonium compound and a silane compound which may be used for the resin composition for encapsulating a semiconductor of the present invention include compounds represented by the following formula (11).

[Chemical Formula 13]

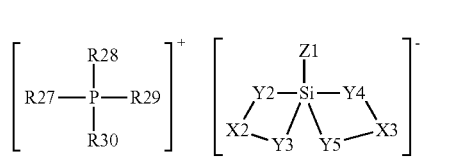

(11)

In the general formula (11), P represents a phosphorus atom; Si represents a silicon atom; R27, R28, R29 and R30 each independently represent an organic group having an aromatic ring or a heterocyclic ring, or an aliphatic group; X2 is an organic group that bonds groups Y2 and Y3; X3 is an organic group that bonds groups Y4 and Y5; Y2 and Y3 each represent a group formed when a proton-donating group releases a proton, and groups Y2 and Y3 in the same molecule are linked with the silicon atom to form a chelate structure; Y4 and Y5 each represent a group formed when a proton-donating group releases a proton, and groups Y4 and Y5 in the same molecule are linked with the silicon atom to form a chelate structure; X2 and X3 may be the same or different from each other; Y2, Y3, Y4 and Y5 may be the same or different from each other; and Z1 is an organic group having an aromatic ring or a heterocyclic ring, or an aliphatic group.

Examples of R27, R28, R29 and R30 in the general formula (11) include a phenyl group, a methylphenyl group, a methoxyphenyl group, a hydroxyphenyl group, a naphthyl group, a hydroxynaphthyl group, a benzyl group, a methyl group, an ethyl group, an n-butyl group, an n-octyl group, a cyclohexyl group and the like. Among these, more preferably used are aromatic groups having a substituent or unsubstituted aromatic groups such as a phenyl group, a methylphenyl group, a methoxyphenyl group, a hydroxyphenyl group, a hydroxynaphthyl group and the like.

Furthermore, in the general formula (11), X2 is an organic group that bonds groups Y2 and Y3. Similarly, X3 is an organic group that bonds groups Y4 and Y5. Y2 and Y3 are each a group formed when a proton-donating group releases a proton, and groups Y2 and Y3 in the same molecule are linked with the silicon atom to form a chelate structure. Similarly, Y4 and Y5 are each a group formed when a proton-donating group releases a proton, and groups Y4 and Y5 in the same molecule are linked with the silicon atom to form a chelate structure. The group X2 and group X3 may be the same or different from each other, and groups Y2, Y3, Y4, and Y5 may be the same or different from one another. The group represented by —Y2-X2-Y3- and the group represented by Y4-X3-Y5- in the general formula (11) are each a group formed when a proton donor releases two protons. Examples of the proton donor include catechol, pyrogallol, 1,2-dihydroxynaphthalene, 2,3-dihydroxynaphthalene, 2,2'-biphenol, 1,1'-bi-2-naphthol, salicylic acid, 1-hydroxy-2-naphthoic acid, 3-hydroxy-2-naphthoic acid, chloranilic acid, tannic acid, 2-hydroxybenzyl alcohol, 1,2-cyclohexanediol, 1,2-propanediol, glycerin and the like. Among these, more preferably used are catechol, 1,2-dihydroxynaphthalene and 2,3-dihydroxynaphthalene in view of a balance between availability of a raw material and curing acceleration effect.

Furthermore, in the general formula (11), Z1 represents an organic group having an aromatic ring or a heterocyclic ring, or an aliphatic group. Concrete examples of Z1 include aliphatic hydrocarbon groups such as a methyl group, an ethyl group, a propyl group, a butyl group, a hexyl group, an octyl group and the like; aromatic hydrocarbon groups such as a phenyl group, a benzyl group, a naphthyl group, a biphenyl group and the like; and reactive substituents such as a glycidyloxypropyl group, a mercaptopropyl group, an aminopropyl group, a vinyl group and the like. Among these, more preferably used are a methyl group, an ethyl group, a phenyl group, a naphthyl group and a biphenyl group from the viewpoint of thermal stability.

As a method for producing an adduct of a phosphonium compound and a silane compound, a silane compound such as phenyltrimethoxysilane and a proton donor such as 2,3-dihydroxynaphthalene are added to methanol in a flask and dissolved. Next, a sodium methoxide-methanol solution is added dropwise thereto under stirring at room temperature. A solution prepared by dissolving a tetra-substituted phosphonium halide such as tetraphenyl phosphonium bromide in methanol in advance is added dropwise to the resulting reaction product under stirring at room temperature to precipitate crystals. The precipitated crystals are filtered, washed with water, and then dried in vacuum. Thus, an adduct of a phosphonium compound and a silane compound is obtained. However, the method is not limited thereto.

The lower limit of the mixing ratio of the curing accelerator (D) which may be used for the resin composition for encapsulating a semiconductor of the present invention is preferably equal to or more than 0.1% by mass in the total resin composition. When the lower limit of the mixing ratio of the curing accelerator (D) is within the above range, sufficient curability may be achieved. On the other hand, the upper limit of the mixing ratio of the curing accelerator (D) is preferably equal to or less than 1% by mass in the total resin composition. When the upper limit of the mixing ratio of the curing accelerator (D) is within the above range, sufficient flowability may be achieved.

In the present invention, a compound (E) in which a hydroxyl group is bonded to each of two or more adjacent carbon atoms constituting an aromatic ring (hereinafter referred to as the compound (E)) may be further used. The compound (E) in which a hydroxyl group is bonded to each of two or more adjacent carbon atoms constituting an aromatic ring is used as a curing accelerator (D) for accelerating a crosslinking reaction between the phenol resin and the epoxy resin. Thus, even when a phosphorus atom-containing curing accelerator without having latency is used, the reaction of the resin composition during the melt-kneading may be suppressed with the use of the compound (E), so that a stable resin composition can be obtained. Furthermore, the compound (E) also has an effect of decreasing the melt viscosity of the resin composition and increasing flowability. Examples of the compound (E) include a monocyclic compound represented by the following general formula (12), a polycyclic compound represented by the following general formula (13) and the like, and these compounds may have a substituent other than a hydroxyl group.

[Chemical Formula 14]

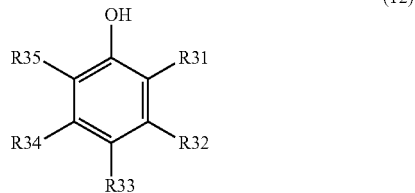

(12)

In the general formula (12), any one of R31 and R35 is hydroxyl group; when one of R31 and R35 is a hydroxyl group, the other is a hydrogen atom, a hydroxyl group or a substituent other than a hydroxyl group; and R32, R33 and R34 are each a hydrogen atom, a hydroxyl group or a substituent other than a hydroxyl group.

[Chemical Formula 15]

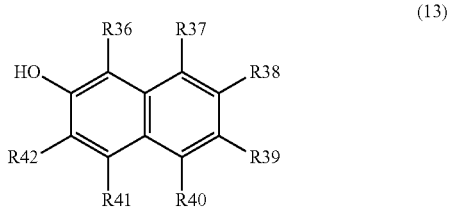

(13)

In the general formula (13), any one of R36 and R42 is a hydroxyl group; when one of R36 and R42 is a hydroxyl group, the other is a hydrogen atom, a hydroxyl group or a substituent other than a hydroxyl group; and R37, R38, R39, R40 and R41 are each a hydrogen atom, a hydroxyl group or a substituent other than a hydroxyl group.

Concrete examples of the monocyclic compound represented by the general formula (12) include catechol, pyrogallol, gallic acid, gallic acid esters and their derivatives. Concrete examples of the polycyclic compound represented by the general formula (13) include 1,2-dihydroxynaphthalene, 2,3-dihydroxynaphthalene and their derivatives. Among these, from the viewpoint of ease of control of flowability and curability, preferably used is a compound in which a hydroxyl group is bonded to each of two adjacent carbon atoms constituting an aromatic ring. Furthermore, in consideration of volatilization in a step of kneading, more preferably used is a compound having, as a mother nucleus, a naphthalene ring, which has low volatility and high weighing stability. In this case, the compound (E) may be specifically, for example, a compound having a naphthalene ring such as 1,2-dihydroxynaphthalene, 2,3-dihydroxynaphthalene and their derivatives. These compounds (E) may be used singly or may be used in combination of two or more kinds.

The lower limit of the mixing ratio of the compound (E) is preferably equal to or more than 0.01% by mass, more preferably equal to or more than 0.03% by mass, and particularly preferably equal to or more than 0.05% by mass, based on the total resin composition. When the lower limit of the mixing ratio of the compound (E) is within the above range, sufficiently low viscosity and improvement of flowability of the resin composition may be achieved. Furthermore, the upper limit of the mixing ratio of the compound (E) is preferably equal to or less than 1% by mass, more preferably equal to or less than 0.8% by mass, and particularly preferably equal to or less than 0.5% by mass, based on the total resin composition. When the upper limit of the mixing ratio of the compound (E) is within the above range, there is little risk of causing a decrease in curability of the resin composition and a degradation of physical properties of a cured product.

In the resin composition for encapsulating a semiconductor of the present invention, for the purpose of improving adhesion between the epoxy resin and the inorganic filler, a coupling agent (F) such as a silane coupling agent or the like may be added. The coupling agent is not particularly limited, and examples thereof include epoxysilane, aminosilane, ureidosilane, mercaptosilane and the like, and it may be any one which can be reacted between an epoxy resin and an inorganic filler to improve the interfacial strength between the epoxy resin and the inorganic filler. Furthermore, when the silane coupling agent may be used together with the above-stated compound (E), the compound (E) reduces the melt viscosity of the resin composition and improves flowability by the synergic effect with the silane coupling agent. For example, the coupling agent (F) of the present invention may contain a silane coupling agent having a secondary amino group.

Examples of the epoxysilane include γ-glycidoxypropyltriethoxysilane, γ-glycidoxypropyltrimethoxysilane, γ-glycidoxypropylmethyldimethoxysilane, β-(3,4-epoxycyclohexyl)ethyltrimethoxysilane and the like. Examples of the aminosilane include γ-aminopropyltriethoxysilane, γ-aminopropyltrimethoxysilane, N-β(aminoethyl)γ-aminopropyltrimethoxysilane, N-β(aminoethyl)γ-aminopropylmethyldimethoxysilane, N-phenylγ-aminopropyltriethoxysilane, N-phenylγ-aminopropyltrimethoxysilane, N-β(aminoethyl)γ-aminopropyltriethoxysilane, N-6-(aminohexyl)3-aminopropyltrimethoxysilane, N-(3-(trimethoxysilylpropyl)-1,3-benzenedimethanane and the like. Examples of the ureidosilane include γ-ureidopropyltriethoxysilane, hexamethyldisilazane and the like. A latent aminosilane coupling agent protected by reacting primary amino moiety of aminosilane with ketone or aldehyde may be used. Examples of the mercaptosilane include a silane coupling agent exhibiting the same function as the mercaptosilane coupling agent by thermal decomposition, such as bis(3-triethoxysilylpropyl)tetrasulfide and bis(3-triethoxysilylpropyl)disulfide, and the like, in addition to γ-mercaptopropyltrimethoxysilane and 3-mercaptopropylmethyldimethoxysilane. These silane coupling agents may also be added after hydrolyzing in advance. These silane coupling agents may be used singly or may be used in combination of two or more kinds.

In the present invention, from the viewpoint of a balance between solder resistance and continuous molding property, preferably used is mercaptosilane, and from the viewpoint of flowability, preferably used is aminosilane. From the viewpoint of adhesion to an organic member of polyimide on the silicon chip surface or solder resist on the substrate surface, preferably used is epoxysilane.

The lower limit of the mixing ratio of the coupling agent (F) such as a silane coupling agent or the like which may be used for the resin composition for encapsulating a semiconductor of the present invention is preferably equal to or more than 0.01% by mass, more preferably equal to or more than 0.05% by mass, and particularly preferably equal to or more than 0.1% by mass, based on the total resin composition. When the lower limit of the mixing ratio of the coupling agent (F) such as a silane coupling agent or the like is within the above range, excellent soldering crack resistance in the semiconductor device may be achieved without lowering the interfacial strength between the epoxy resin and the inorganic filler. On the other hand, the upper limit of the mixing ratio of the coupling agent (F) such as a silane coupling agent or the like is preferably equal to or less than 1% by mass, more preferably equal to or less than 0.8% by mass, and particularly preferably equal to or less than 0.6% by mass, based on the total resin composition. When the upper limit of the mixing ratio of the coupling agent (F) such as a silane coupling agent or the like is within the above range, excellent soldering crack resistance in the semiconductor device may be achieved without lowering the interfacial strength between the epoxy resin and the inorganic filler. Also, when the mixing ratio of the coupling agent (F) such as a silane coupling agent or the like is within the above range, excellent soldering crack resistance in the semiconductor device may be achieved without increasing moisture absorption of the cured product of the resin composition.

In the resin composition for encapsulating a semiconductor of the present invention, the inorganic flame retardant (G) may be added in order to enhance flame retardance. In particular, metal hydroxide or complex metal hydroxide blocking a combustion reaction by dehydration and heat-absorbing during combustion is preferred because the time taken to combustion up can be shortened. Examples of the metal hydroxide include aluminum hydroxide, magnesium hydroxide, calcium hydroxide, barium hydroxide and zirconium hydroxide. The complex metal hydroxide may be good as long as it is a hydrotalcite compound containing two or more metallic elements in which at least one metallic element is magnesium, and other metallic elements are metallic elements selected from calcium, aluminum, tin, titanium, iron, cobalt, nickel, copper and zinc. As such a complex metal hydroxide, a magnesium hydroxide and zinc hydroxide solid solution is easily available as a commercial product. Among these, from the viewpoint of a balance between solder resistance and continuous molding property, preferably used are aluminum hydroxide, and a magnesium hydroxide and zinc hydroxide solid solution. The flame retardants may be used singly or may be used in combination of two or more kinds. Furthermore, for the purpose of reducing an effect on continuous molding property, a surface treatment may be subjected using a silicon compound such as a silane coupling agent or an aliphatic compound such as wax.

The resin composition for encapsulating a semiconductor of the present invention may further properly contain, in addition to the aforementioned components, a coloring agent such as carbon black, bengala, titanium oxide or the like; a natural wax such as a carnauba wax or the like; a synthetic wax such as a polyethylene wax or the like; a releasing agent such as a higher fatty acid and metal salts thereof, for example, stearic acid, zinc stearate or the like, or paraffin; and a low-stress additive such as silicone oil, silicone rubber or the like.

The resin composition for encapsulating a semiconductor of the present invention may be prepared by homogeneously mixing the phenol resin, the epoxy resin, the inorganic filler and the above-stated other additive at an ambient temperature using a mixer or the like, and thereafter, as necessary, melt-kneading the homogenous mixture using a kneading machine such as a heating roller, a kneader or an extruder, and then cooling and pulverizing the mixture as necessary. The composition may be prepared to have desirable dispersibility and flowability.

Next, the semiconductor device of the present invention will be described. As a method for producing a semiconductor device using the resin composition for encapsulating a semiconductor of the present invention, for example, a lead frame or a circuit board on which a semiconductor element is mounted is placed in a mold cavity, and then the resin composition for encapsulating a semiconductor is molded by a molding method such as transfer molding, compression molding, injection molding or the like and is cured in the mold, whereby the semiconductor element is encapsulated.

Examples of the semiconductor element to be encapsulated include integrated circuits, large scale integrated circuits, transistors, thyristors, diodes, solid-state image sensing devices and the like, but are not restricted thereto.

Examples of the shape of the obtained semiconductor device include a dual in-line package (DIP), a plastic leaded chip carrier (PLCCs), a quad flat package (QFP), a low-profile quad flat package (LQFP), a small outline package (SOP), a small outline J-leaded package (SOJ), a thin small outline package (TSOP), a thin quad flat package (TQFP), a tape carrier package (TCP), a ball grid array (BGA), a chip size package (CSP), a matrix array package ball grid array (MAPBGA), a chip stacked chip size package and the like, but are not restricted thereto.

The semiconductor device in which a semiconductor element is encapsulated by a molding method such as transfer molding or the like of the resin composition for encapsulating a semiconductor may be mounted on any electronic device without curing or after completely curing the resin composition at a temperature of about 80 to 200 degrees centigrade over a period of about 10 minutes to 10 hours.

FIG. 1 is a view illustrating a cross-section structure of an example of a semiconductor device using a resin composition for encapsulating a semiconductor according to the present invention. A semiconductor element 1 is fixed on a die pad 3 via a cured die bond material 2. An electrode pad of the semiconductor element 1 and a lead frame 5 are connected by a wire 4. The semiconductor element 1 is encapsulated with a cured product 6 of the resin composition for encapsulating a semiconductor.

Figure 2:
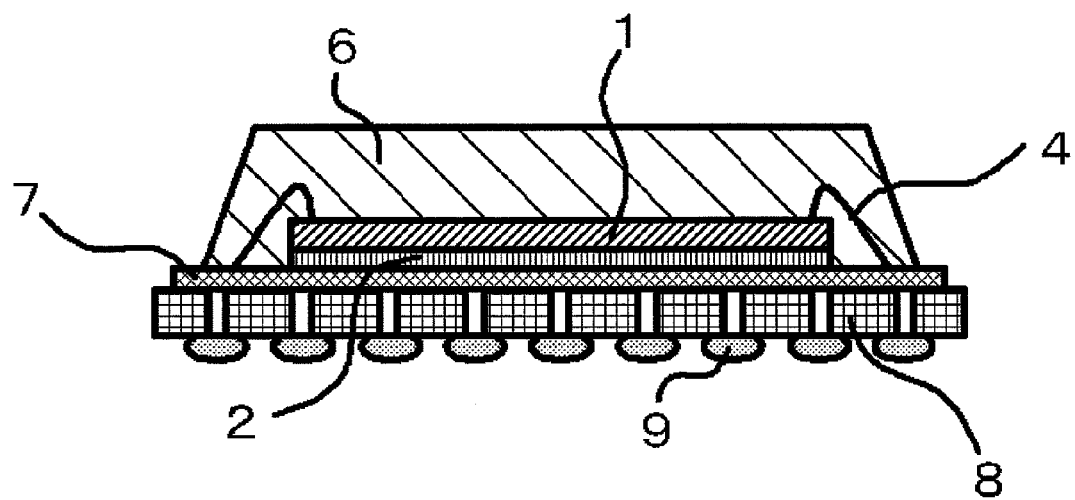
FIG. 2 is a view illustrating a cross-section structure of an example of a one-side encapsulated semiconductor device using a resin composition for encapsulating a semiconductor according to the present invention.

FIG. 2 is a view illustrating a cross-section structure of an example of a one-side encapsulated semiconductor device using a resin composition for encapsulating a semiconductor according to the present invention. A semiconductor element 1 is fixed on a substrate 8 through a solder resist 7 and a cured die bond material 2. An electrode pad of the semiconductor element 1 and an electrode pad on the substrate 8 are connected by means of a wire 4. Only one side on which the semiconductor element 1 of the substrate 8 is mounted is encapsulated with a cured product 6 of the resin composition for encapsulating a semiconductor. The electrode pad on the substrate 8 is internally connected to a solder ball 9 provided on the non-encapsulated surface of the substrate 8.

EXAMPLES

Hereinafter, the present invention will be described in detail with reference to Examples. However, the present invention is not restricted to these Examples. In the following Examples, the mixing amount of each component is represented by "parts by mass" unless otherwise particularly noted.

Curing Agent

As the curing agent, the following phenol resins 1 to 7 were used.

Figure 3:
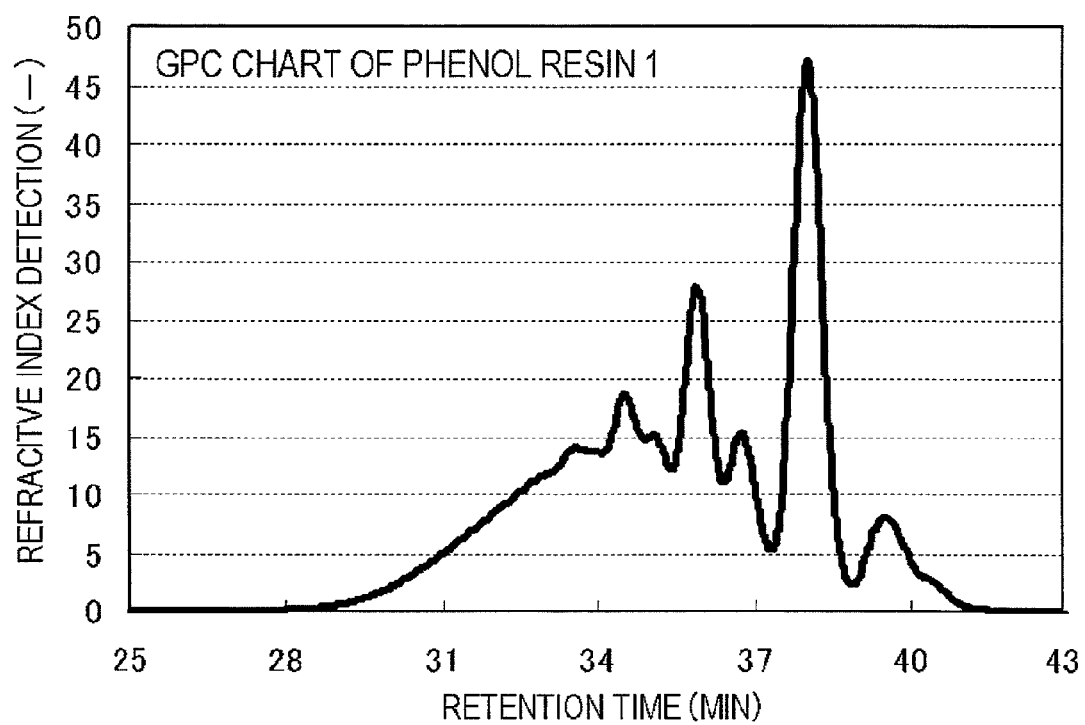
FIG. 3 is a GPC chart of a phenol resin 1 used in Example.
Figure 7:
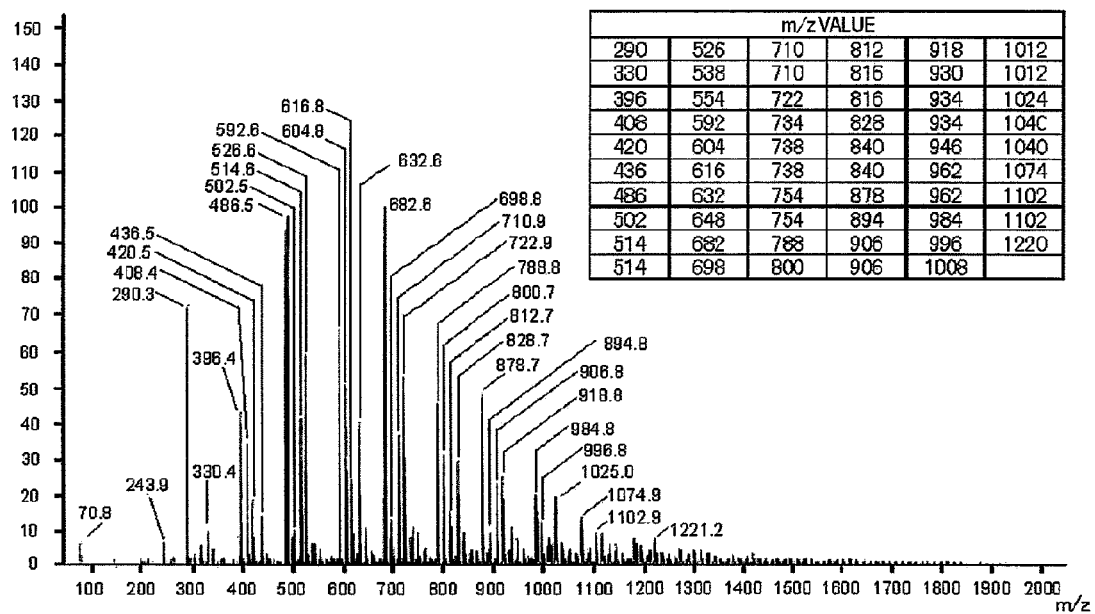
FIG. 7 is a FD-MS chart of a phenol resin 1 used in Example.

Phenol Resin 1: A separable flask was equipped with a stirring device, a thermometer, a reflux condenser and a nitrogen inlet. 100 parts by mass of m-xylene (m-xylene, a special grade reagent, manufactured by Kanto Chemical Co., Inc., boiling point: 139 degrees centigrade, molecular weight: 106, purity: 99.4%) and 198 parts by mass of 20% by mass sodium hydroxide were weighed in the flask. Then, while the flask was purged with nitrogen, the resulting mixture began to be heated. The mixture was stirred for 30 minutes while maintaining the temperature in the system in the range of 50 to 60 degrees centigrade and cooled to 10 degrees centigrade. Subsequently, 47.2 parts by mass of paraformaldehyde (paraformaldehyde, a special grade reagent, manufactured by Kanto Chemical Co., Inc., molecular weight: 106, purity: 90%, pulverized one in the form of particles) was added thereto at once and reacted for 2 hours with stirring, and then 100 parts by mass of a 38% by mass aqueous hydrochloric acid solution was gradually added to neutralize the system, whereby an intermediate containing a methylolide was obtained. Incidentally, during the period of from initiation of the reaction to completion of the neutralization, the temperature was controlled such that the temperature in the system was in the range of 10 to 15 degrees centigrade. To this intermediate were further added 847 parts by mass of phenol (phenol, a special grade reagent, manufactured by Kanto Chemical Co., Inc., melting point: 40.9 degrees centigrade, molecular weight: 94, purity: 99.3%) and 343 parts by mass of $\alpha,\alpha'$-dichloro-p-xylene (a reagent, manufactured by Tokyo Chemical Industry, Co., Ltd., melting point: 100 degrees centigrade, molecular weight: 175, purity: 98%). The resulting mixture was heated while purging the flask with nitrogen and stirring, and the reaction was carried out for 5 hours while maintaining the temperature in the system in the range of 110 to 120 degrees centigrade. Hydrochloric acid gas generated in the system by the above reaction was discharged out of the system by nitrogen flow. After completion of the reaction, the unreacted component and moisture were removed under reduced-pressure condition of 2 mmHg at 150 degrees centigrade. Subsequently, 200 parts by mass of toluene was added, and the mixture was homogeneously dissolved, and then transferred to a separating funnel. After 150 parts by mass of distilled water was added thereto and shaken, an operation (water washing) to remove a water layer was repeatedly carried out until cleaning water became neutralized, and then an oil layer was depressurized at 125 degrees centigrade to remove volatile components such as toluene, remained unreacted component and the like, whereby a phenol resin 1 represented by the following formula (14) (a mixture of polymers in which, in the formula (14), p was an integer of 0 to 20, q was an integer of 0 to 20, and r was an integer of 0 to 20, mean values of p, q and r were respectively 1.7, 0.3 and 0.6, hydroxyl equivalent: 175, softening point: 64 degrees centigrade, ICI viscosity at 150 degrees centigrade: 0.47 dPa·s) was obtained. A GPC chart of the resulting phenol resin 1 is illustrated in FIG. 3, and a FD-MS chart is illustrated in FIG. 7. For example, m/z=514 of FD-MS analysis in FIG. 7 corresponded to a component in which (p,q,r)=(1,1,0) in the formula (14), a left end was a hydrogen atom and a right end was a hydroxyphenyl group, and m/z=526 corresponded to a component in which (p,q,r)=(1,1,0) in the formula (14), a left end was a hydrogen atom and a right end was m-xylene, so that the phenol resin 1 was confirmed to contain the component (A1) composed of a polymer having the structural unit represented by the general formula (1) and the structural unit represented by the general formula (2). Furthermore, in the measurement according to the area method of gel permeation chromatography, the amount of binuclear components was 6.8%, while in the measurement according to the relative intensity ratio of FD-MS, the total amount of polymers corresponding to the component (A1), the total amount of polymers corresponding to the component (A2) and the total amount of polymers corresponding to the component (A3) were respectively 28%, 66% and 6% in terms of the relative intensity ratio. Furthermore, the ratio of the total number of structural units represented by the general formula (1) to the total number of structural units represented by the general formula (2) was 85/15 in the total phenol resin 1.

Herein, the content of binuclear components according to the measurement by the area method of gel permeation chromatography was calculated in the following manner.

First, the weight average molecular weight was determined by a GPC measurement and was calculated on the basis of a calibration curve prepared using a polystyrene standard material. The content of binuclear components was calculated by the area ratio (%) of the binuclear components based on the total phenol resin (A) from the obtained molecular weight distribution curve. Incidentally, GPC measurement was carried out under conditions of a flow rate of 1.0 ml/min and a column temperature of 40 degrees centigrade with the use of tetrahydrofuran as the eluting solvent. The device in use is as follows.

Apparatus: HLC-8020, manufactured by Tosoh Corporation

Detector: UV-8011, manufactured by Tosoh Corporation (set to a wavelength of 280 nm)

Analysis column: SHODEX KF-802, KF-803, KF-805, manufactured by Showa Denko Co., Ltd., combined in series in this order The softening point was measured in accordance with JIS K7234, using the value measured by a ring and ball method.

The ICI viscosity at 150 degrees centigrade was measured with a cone plate type viscometer CV-1S manufactured by Toa Industry Co., Ltd.

Figure 4:
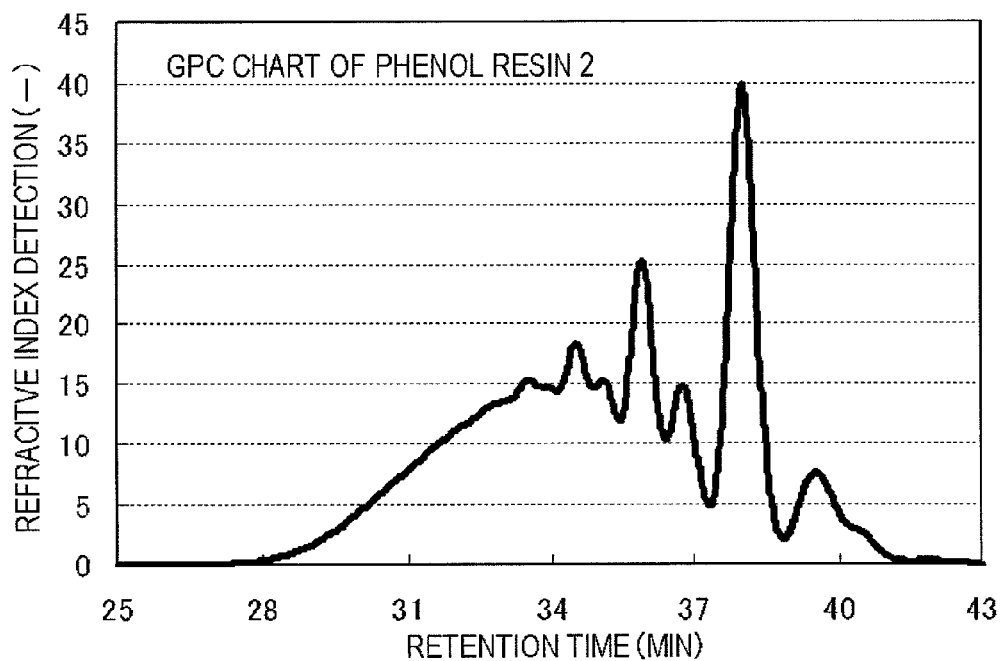
FIG. 4 is a GPC chart of a phenol resin 2 used in Example.
Figure 8:
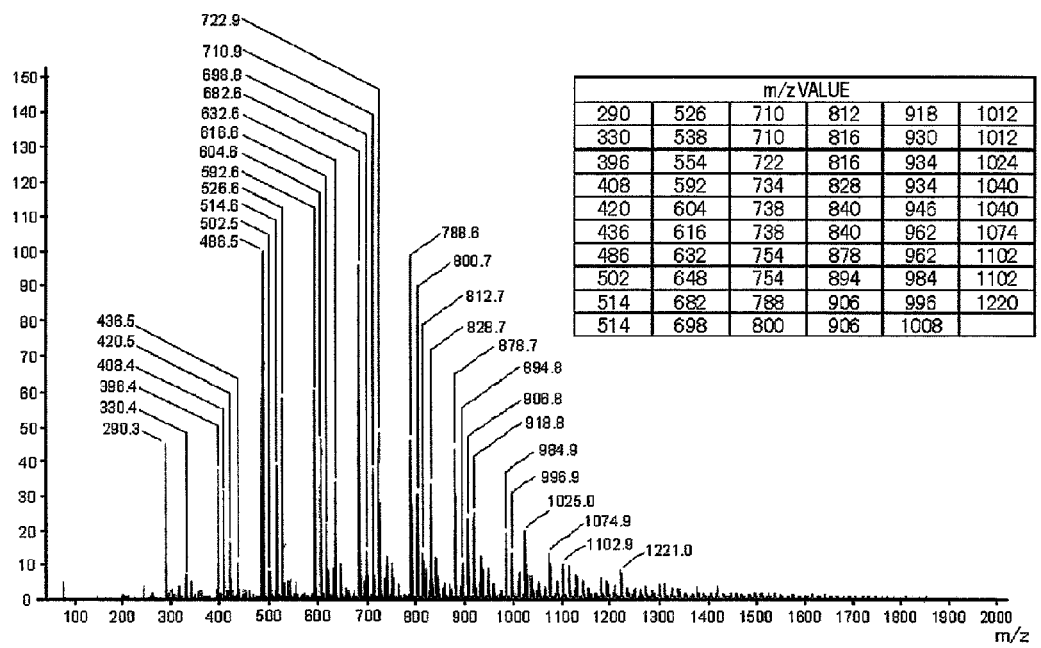
FIG. 8 is a FD-MS chart of a phenol resin 2 used in Example.

Phenol Resin 2: A separable flask was equipped with a stirring device, a thermometer, a reflux condenser and a nitrogen inlet. 116.3 parts by mass of a 37% aqueous formaldehyde solution (formalin 37%, manufactured by Wako Pure Chemical Industries, Ltd.), 37.7 parts by mass of 98% by mass sulfuric acid and 100 parts by mass of m-xylene (m-xylene, a special grade reagent, manufactured by Kanto Chemical Co., Inc., boiling point: 139 degrees centigrade, molecular weight: 106, purity: 99.4%) were weighed in the flask. Then, while the flask was purged with nitrogen, the resulting mixture began to be heated. The mixture was stirred for 6 hours while maintaining the temperature in the system in the range of 90 to 100 degrees centigrade and cooled to room temperature. Subsequently, 150 parts by mass of 20% by mass sodium hydroxide was gradually added to neutralize the system. To this reaction system were added 839 parts by mass of phenol and 338 parts by mass of $\alpha,\alpha'$-dichloro-p-xylene. The resulting mixture was heated while purging the flask with nitrogen and stirring, and the reaction was carried out for 5 hours while maintaining the temperature in the system in the range of 110 to 120 degrees centigrade. Hydrochloric acid gas generated in the system by the above reaction was discharged out of the system by nitrogen flow. After completion of the reaction, the unreacted component and moisture were removed under reduced-pressure condition of 2 mmHg at 150 degrees centigrade. Subsequently, 200 parts by mass of toluene was added, and the mixture was homogeneously dissolved, and then transferred to a separating funnel. After 150 parts by mass of distilled water was added thereto and shaken, an operation (water washing) to remove a water layer was repeatedly carried out until cleaning water became neutralized, and then an oil layer was depressurized at 125 degrees centigrade to remove volatile components such as toluene, remained unreacted component and the like, whereby a phenol resin 2 represented by the following formula (14) (a mixture of polymers in which, in the formula (14), p was an integer of 0 to 20, q was an integer of 0 to 20, and r was an integer of 0 to 20, mean values of p, q and r were respectively 1.8, 0.3, 0.6, hydroxyl equivalent: 180, softening point: 67 degrees centigrade, ICI viscosity at 150 degrees centigrade: 0.60 dPa·s) was obtained. A GPC chart of the resulting phenol resin 2 is illustrated in FIG. 4, while a FD-MS chart is illustrated in FIG. 8. For example, m/z=514 of FD-MS analysis in FIG. 8 corresponded to a component in which (p,q,r)=(1,1,0) in the formula (14), a left end was a hydrogen atom and a right end was a hydroxyphenyl group, and m/z=526 corresponded to a component in which (p,q,r)=(1,1,0) in the formula (14), a left end was a hydrogen atom and a right end was m-xylene, so that the phenol resin 2 was confirmed to contain the component (A1) composed of a polymer having the structural unit represented by the general formula (1) and the structural unit represented by the general formula (2). Furthermore, in the measurement according to the area method of gel permeation chromatography, the amount of binuclear components was 6.6%, while in the measurement according to the relative intensity ratio of FD-MS, the total amount of polymers corresponding to the component (A1), the total amount of polymers corresponding to the component (A2) and the total amount of polymers corresponding to the component (A3) were respectively 30%, 64% and 6% in terms of the relative intensity ratio. Furthermore, the ratio of the total number of structural units represented by the general formula (1) to the total number of structural units represented by the general formula (2) was 85/15 in the total phenol resin 2.

[Chemical Formula 16]

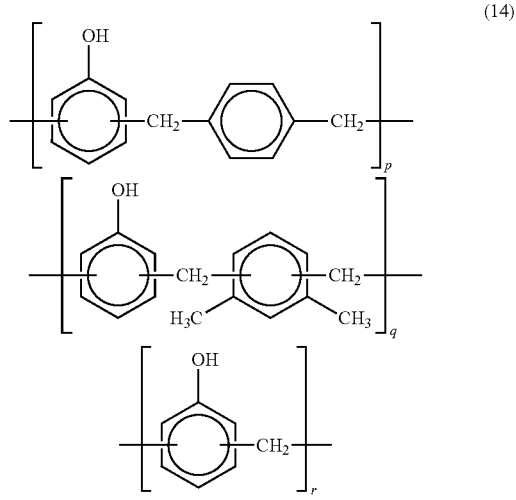

(14)

Figure 5:
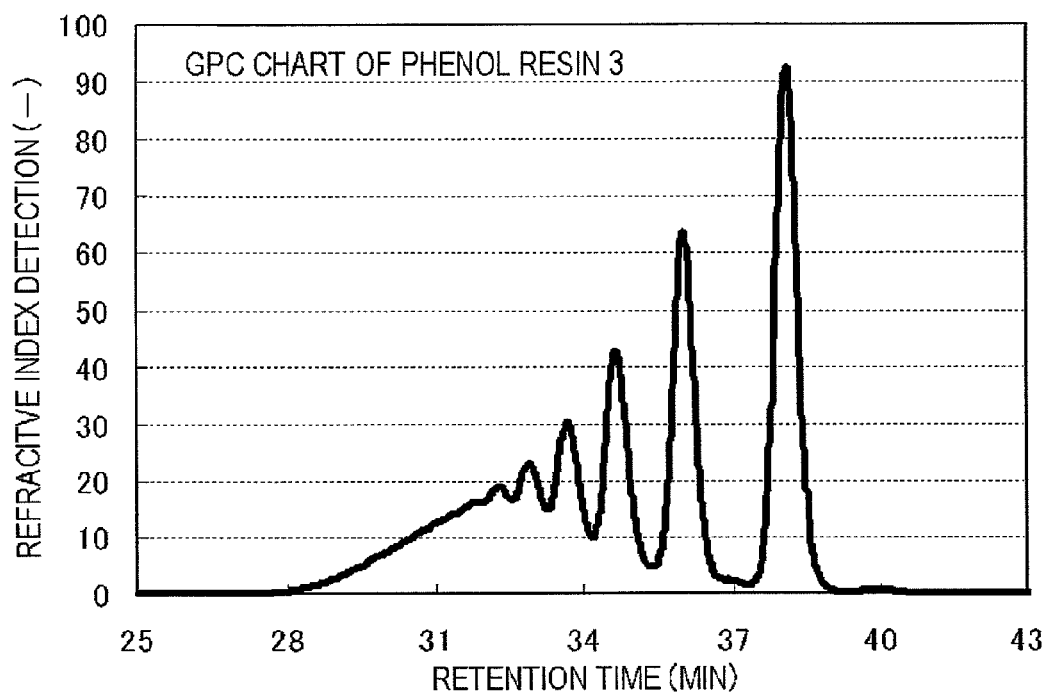
FIG. 5 is a GPC chart of a phenol resin 3 used in Example.
Figure 9:
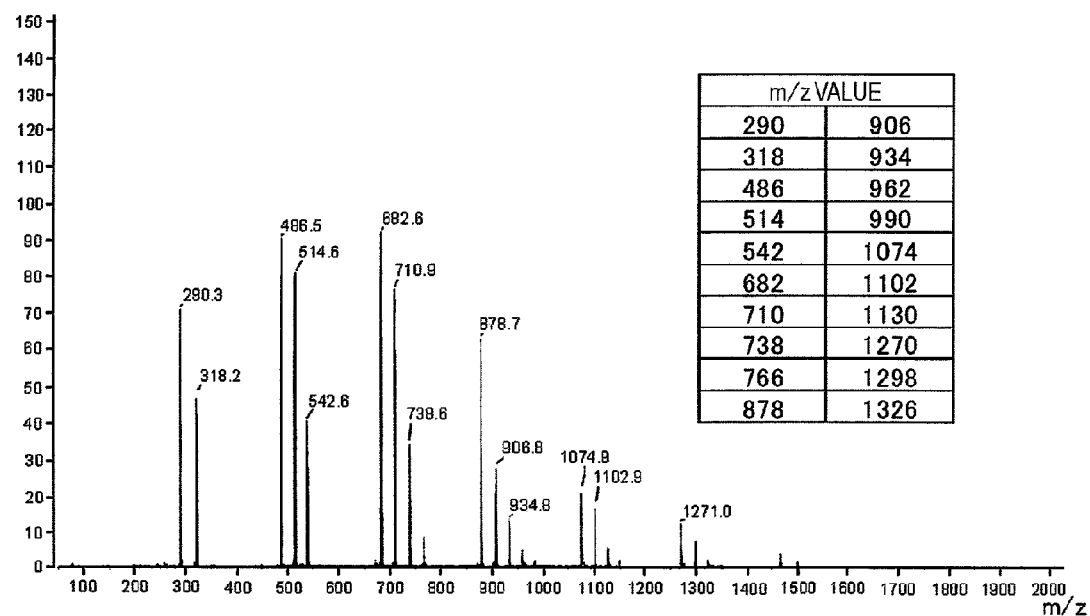
FIG. 9 is a FD-MS chart of a phenol resin 3 used in Example.

Phenol Resin 3: 100 parts by mass of phenol (phenol, a special grade reagent, manufactured by Kanto Chemical Co., Inc., melting point: 40.9 degrees centigrade, molecular weight: 94, purity: 99.3%), 65.2 parts by mass of α,α'-dichloro-p-xylene (a reagent, manufactured by Tokyo Chemical Industry, Co., Ltd., melting point: 100 degrees centigrade, molecular weight: 175, purity: 98%), and 32.4 parts by mass of 2,5-bis-(chloromethyl)-p-xylene (a reagent, manufactured by Sigma-Aldrich Corporation, melting point: 133 degrees centigrade, molecular weight: 203, purity: 98%) were weighed in a separable flask equipped with a stirring device, a thermometer, a reflux condenser and a nitrogen inlet. The resulting mixture was heated while bubbling with nitrogen, and began to be stirred in association with initiation of melting. The reaction was carried out for 5 hours while maintaining the temperature in the system in the range of 110 to 120 degrees centigrade. Hydrogen chloride gas generated in the system by the reaction during the period from initiation to completion of the reaction was promptly discharged out of the system by nitrogen flow. An operation after completion of the reaction was carried out in the same manner as in the phenol resin 1, whereby a phenol resin 3 represented by the following formula (15) (a mixture of polymers in which, in the formula (15), s was an integer of 0 to 20, and t was an integer of 0 to 20, mean values of s and t were respectively 1.6 and 0.6, hydroxyl equivalent: 174, softening point: 68 degrees centigrade, ICI viscosity at 150 degrees centigrade: 0.65 dPa·s) was obtained. A GPC chart is illustrated in FIG. 5, and a FD-MS chart is illustrated in FIG. 9. For example, m/z=514 of FD-MS analysis in FIG. 9 corresponded to a component in which (s,t)=(1,1) in the formula (15), a left end was a hydrogen atom and a right end was a hydroxyphenyl group, so that the phenol resin 3 was confirmed to contain the component (A1) composed of a polymer having the structural unit represented by the general formula (1) and the structural unit represented by the general formula (2). Furthermore, in the measurement according to the area method of gel permeation chromatography, the binuclear component was not detected, while in the measurement according to the relative intensity ratio of FD-MS, the total amount of polymers corresponding to the component (A1), the total amount of polymers corresponding to the component (A2) and the total amount of polymers corresponding to the component (A3) were respectively 36.5%, 48.5% and 15.0% in terms of the relative intensity ratio. Furthermore, the ratio of the total number of structural units represented by the general formula (1) to the total number of structural units represented by the general formula (2) was 72/28 in the total phenol resin 3.

[Chemical Formula 17]

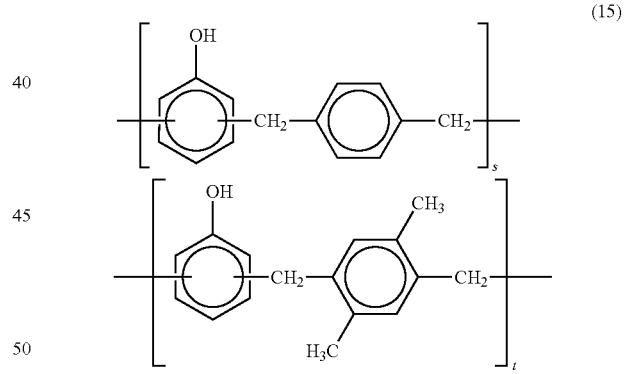

(15)

Figure 6:
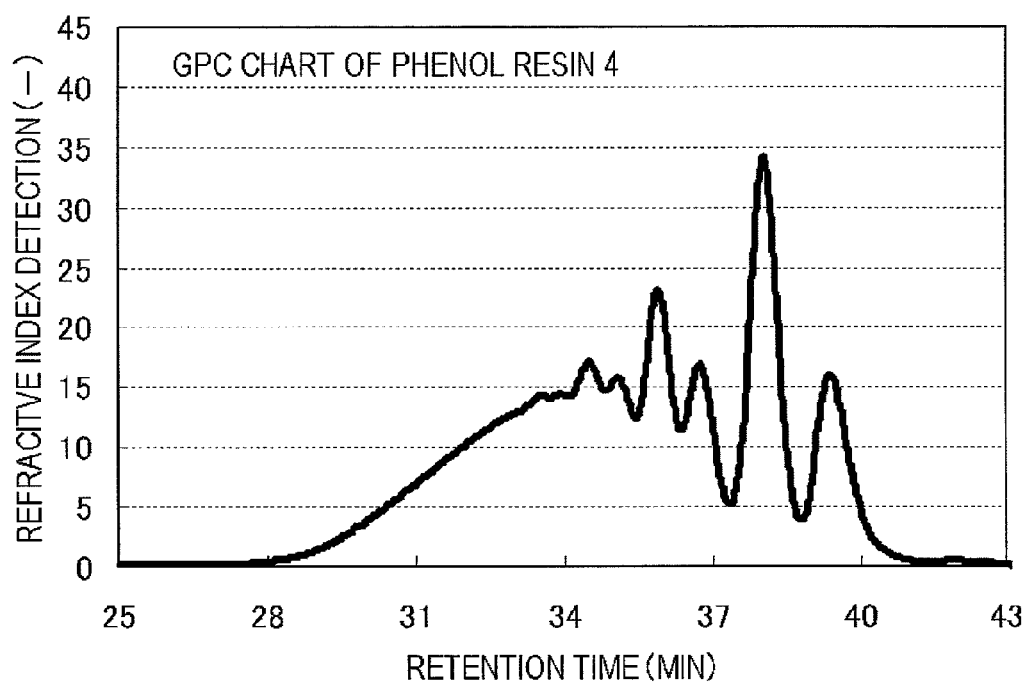
FIG. 6 is a GPC chart of a phenol resin 4 used in Example.
Figure 10:
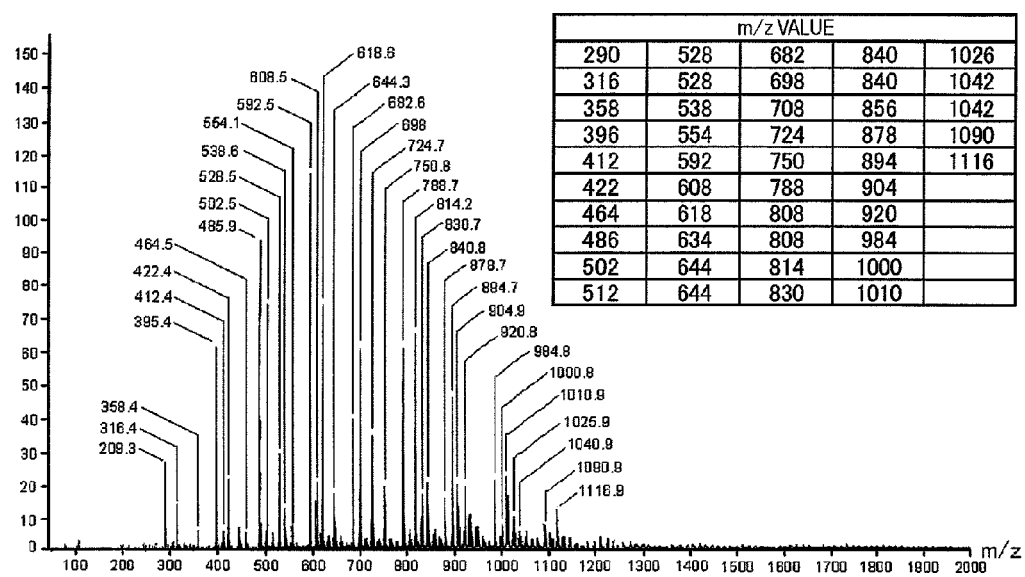
FIG. 10 is a FD-MS chart of a phenol resin 4 used in Example.

Phenol Resin 4: A synthesis operation was carried out in the same manner as in the phenol resin 1, except that 100 parts by mass of 1,3,5-trimethylbenzene (a Cica special grade reagent, manufactured by Tokyo Chemical Industry, Co., Ltd., boiling point: 165 degrees centigrade, molecular weight: 120, purity: 99%) was used in place of m-xylene, the mixing amount of 20% by mass sodium hydroxide was changed to 175 parts by mass, the mixing amount of paraformaldehyde was changed to 66.7 parts by mass, the mixing amount of phenol was changed to 1,372 parts by mass, and the mixing amount of α,α'-dichloro-p-xylene was changed to 620 parts by mass, in the synthesis of the phenol resin 1, whereby a phenol resin 4 represented by the following formula (16) (a mixture of polymers in which, in the formula (16), u was an integer of 0 to 20, v was an integer of 0 to 20, and w was an integer of 0 to 20, mean values of u, v, w were respectively 1.9, 0.1 and 0.9, hydroxyl equivalent: 164, softening point: 68 degrees centigrade, ICI viscosity at 150 degrees centigrade: 0.65 dPa·s) was obtained. A GPC chart of the resulting phenol resin 4 is illustrated in FIG. 6, while a FD-MS chart is illustrated in FIG. 10. For example, m/z=528 of FD-MS analysis in FIG. 10 corresponded to a component in which (u,v,w)=(1,1,0) in the formula (16), a left end was a hydrogen atom and a right end was a hydroxyphenyl group, so that the phenol resin 4 was confirmed to contain the component (A1) composed of a polymer having the structural unit represented by the general formula (1) and the structural unit represented by the general formula (2). Furthermore, in the measurement according to the area method of gel permeation chromatography, the amount of binuclear components was 11%, while in the measurement according to the relative intensity ratio of FD-MS, the total amount of polymers corresponding to the component (A1), the total amount of polymers corresponding to the component (A2), the total amount of polymers corresponding to the component (A3) and the total amount of components not corresponding to (A1) to (A3) (u=v=o) were respectively 12%, 86%, 1% and 1% in terms of the relative intensity ratio. Furthermore, the ratio of the total number of structural units represented by the general formula (1) to the total number of structural units represented by the general formula (2) was 94/6 in the total phenol resin 4.

[Chemical Formula 18]

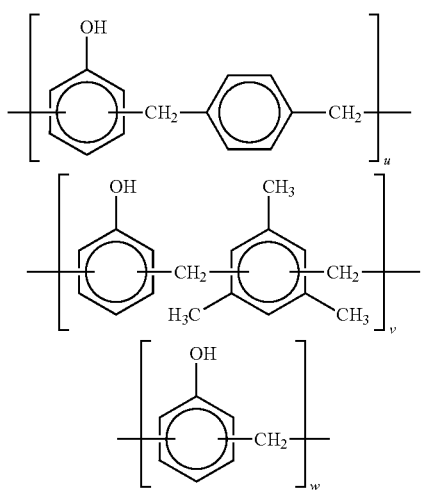

(16)

Phenol Resin 5: A phenol aralkyl resin having a phenylene skeleton (XLC-4L, manufactured by Mitsui Chemicals, Inc., hydroxyl equivalent: 168, softening point: 62 degrees centigrade, ICI viscosity at 150 degrees centigrade: 0.76 dPa·s)

Phenol Resin 6: 100 parts by mass of phenol (phenol, a special grade reagent, manufactured by Kanto Chemical Co., Inc., melting point: 40.9 degrees centigrade, molecular weight: 94, purity: 99.3%), 67.7 parts by mass of a xylene formaldehyde resin (Nikanol LLL, manufactured by Fudow Co., Ltd., average molecular weight: 340), and 0.03 parts by mass of p-toluenesulfonic acid monohydrate (p-toluenesulfonic acid, manufactured by Wako Pure Chemical Industries, Ltd., molecular weight: 190, purity: 99%) were weighed in a separable flask. While the flask was purged with nitrogen, the resulting mixture was heated and began to be stirred in association with initiation of melting. After it was confirmed that the temperature in the system reached 110 degrees centigrade and the reaction was carried out for 1 hour, 48.8 parts by mass of a 37% aqueous formaldehyde solution (formalin 37%, manufactured by Wako Pure Chemical Industries, Ltd.) and 0.5 parts by mass of oxalic acid were added thereto over 30 minutes. Subsequently, the reaction was carried out for 120 minutes while maintaining the temperature in the system in the range of 100 to 110 degrees centigrade. During the period until completion of the reaction, moisture generated in the system by the reaction or entrained into the system along with the addition of formalin was discharged out of the system by nitrogen flow. After completion of the reaction, the unreacted component was removed under reduced-pressure condition of 2 mmHg at 160 degrees centigrade. Subsequently, 200 parts by mass of toluene was added, and the mixture was homogeneously dissolved, and then transferred to a separating funnel. After 150 parts by mass of distilled water was added thereto and shaken, an operation (water washing) to remove a water layer was repeatedly carried out until cleaning water became neutralized, and then an oil layer was depressurized at 125 degrees centigrade to remove volatile components such as toluene, remained unreacted component and the like, whereby a phenol resin 6 represented by the following formula (17) (hydroxyl equivalent: 167, softening point: 86 degrees centigrade, ICI viscosity at 150 degrees centigrade: 2.1 dPa·s) was obtained.

[Chemical Formula 19]

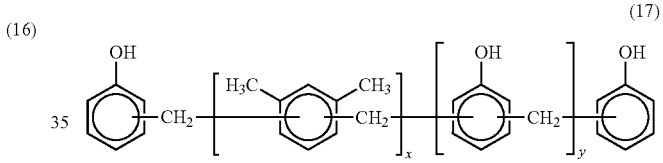

(17)

In the formula, x is an integer of 1 to 10; and y is an integer of 0 to 10.

Phenol Resin 7: A phenol resin represented by the following formula (18) (Xistar GP-90, manufactured by Fudow Co., Ltd., hydroxyl equivalent: 197, softening point: 86 degrees centigrade, ICI viscosity at 150 degrees centigrade: 3.1 dPa·s),

[Chemical Formula 20]

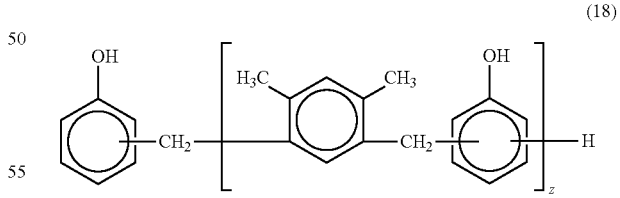

(18)

Phenol Resin 8: A phenol novolac resin (PR-HF-3, manufactured by Sumitomo Bakelite Co., Ltd., hydroxyl equivalent: 104, softening point: 80 degrees centigrade)

The softening points and the ICI viscosities of the phenol resins 1 to 7 were shown in the following Table 1. Furthermore, blocking of these phenol resins was evaluated. The results are shown in Table 1.

Incidentally, evaluation of blocking for the phenol resins was conducted in the following manner. To a polypropylene cylindrical container having an internal diameter of 29 mm and a height of 10 cm was put 20 g of a granular phenol resin cooled to 5 degrees centigrade in advance. A piston having an external size of 29 mm and a mass of 200 g was inserted into the cylindrical container, and a load was applied to the phenol resin by the piston which was positioned vertically upright in a constant temperature bath set to a predetermined temperature for a predetermined period of time. Thereafter, the cylindrical container was put upside down to take out a phenol resin therefrom. At that time, when the phenol resin was easily taken out from the container in the original granular form, it was indicated as A. When it was easily released by hand while having the inside shape of the piston, it was indicated as B. When it was not released by hand as it had the inside shape of the piston, it was indicated as C. When the resin was melted and was not taken out from the container, it was indicated as D.

TABLE 1

| Phenol resin | | 1 | 2 | 3 | 4 | 5 | 6 | 7 |
|---|---|---|---|---|---|---|---|---|
| Softening point [° C.] | | 64 | 67 | 68 | 68 | 62 | 86 | 86 |
| ICI viscosity at 150° C. [dPa · s] | | 0.47 | 0.60 | 0.65 | 0.65 | 0.76 | 2.1 | 3.1 |
| Evaluation of blocking property | 10 hours at 12° C. | A | A | A | A | A | A | A |
| | 10 hours at 15° C. | A | A | B | A | B | A | A |
| | 10 hours at 18° C. | B | B | B | B | D | B | B |

The phenol resins 1 to 4 corresponding to the phenol resin (A) containing the component (A1) composed of a polymer having the structural unit represented by the general formula (1) and the structural unit represented by the general formula (2) had low viscosities, and were excellent in blocking as well, as compared to the phenol resin 5 (XLC-4L, manufactured by Mitsui Chemicals, Inc.) having the structural unit represented by the general formula (1) alone, and the phenol resins 6 and 7 having the structural unit represented by the general formula (2) alone.

Epoxy Resin

The following epoxy resins 1 to 8 were used.

Epoxy Resin 1: A biphenyl type epoxy resin (YX4000K, manufactured by Japan Epoxy Resin Co., Ltd., epoxy equivalent: 185, softening point: 107 degrees centigrade)

Epoxy Resin 2: A bisphenol F type epoxy resin (YSLV-80XY, manufactured by Nippon Steel Chemical Co., Ltd., epoxy equivalent: 190, softening point: 80 degrees centigrade)

Epoxy Resin 3: A sulfide type epoxy resin represented by the following formula (19) (YSLV-120TE, manufactured by Nippon Steel Chemical Co., Ltd., epoxy equivalent: 240, softening point: 120 degrees centigrade)

[Chemical Formula 21]

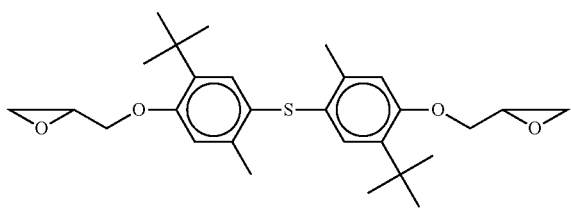

(19)

Epoxy Resin 4: A phenol aralkyl type epoxy resin having a biphenylene skeleton (NC3000, manufactured by Nippon Kayaku Co., Ltd., epoxy equivalent: 276, softening point: 58 degrees centigrade)

Epoxy Resin 5: A bisphenol A type epoxy resin (YL6810, manufactured by Japan Epoxy Resin Co., Ltd., epoxy equivalent: 172, softening point: 45 degrees centigrade)

Epoxy Resin 6: A phenol aralkyl type epoxy resin having a phenylene skeleton (E-XLC-3L, manufactured by Mitsui Chemicals, Inc., epoxy equivalent: 238, softening point: 52 degrees centigrade)

Epoxy Resin 7: A dicyclopentadiene-modified phenol type epoxy resin (HP7200L, manufactured by DIC Corporation, epoxy equivalent: 244, softening point: 56 degrees centigrade)

Epoxy Resin 8: A novolac type epoxy resin having a methoxynaphthalene skeleton (EXA-7320, manufactured by DIC Corporation, epoxy equivalent: 251, softening point: 58 degrees centigrade)

Inorganic Filler

As an inorganic filler, there was used a blend of 100 parts by mass of molten spherical silica FB560 manufactured by Denki Kagaku Kogyo Kabushiki Kaisha (average particle diameter: 30 μm), 6.5 parts by mass of synthetic spherical silica SO-C2 manufactured by Admatechs Company Limited (average particle diameter: 0.5 μm), and 7.5 parts by mass of synthetic spherical silica SO-C5 manufactured by Admatechs Company Limited (average particle diameter: 30 μm).

Curing Accelerator (D)

The following curing accelerators 1 to 5 were used.

Curing accelerator 1: A curing accelerator represented by the following formula (20),

[Chemical Formula 22]

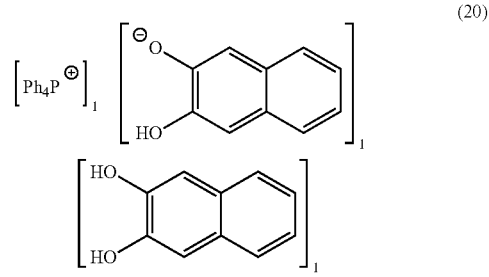

(20)

Curing accelerator 2: A curing accelerator represented by the following formula (21),

[Chemical Formula 23]

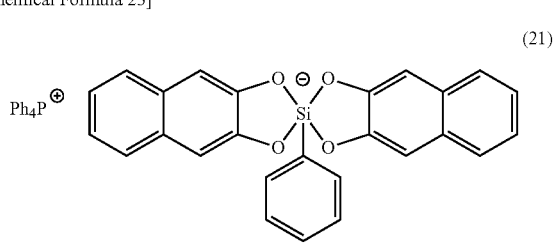

(21)

Curing accelerator 3: A curing accelerator represented by the following formula (22),

[Chemical Formula 24]

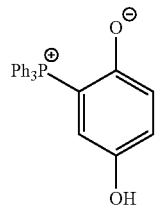

(22)

Curing accelerator 4: A curing accelerator represented by the following formula (23),

[Chemical Formula 25]

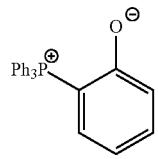

(23)

Curing accelerator 5: Triphenylphosphine (TPP, manufactured by Hokko Chemical Industry Co., Ltd.)

Compound E

As a compound E, a compound represented by the following formula (24) (2,3-naphthalenediol, manufactured by Tokyo Chemical Industry, Co., Ltd., purity: 98%) was used,

[Chemical Formula 26]

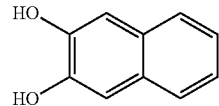

(24)

Silane Coupling Agent

The following silane coupling agents 1 to 3 were used.

Silane Coupling Agent 1:
γ-mercaptopropyltrimethoxysilane (KBM-803, manufactured by Shin-Etsu Chemical Co., Ltd.)

Silane Coupling Agent 2:
γ-glycidoxypropyltrimethoxysilane (KBM-403, manufactured by Shin-Etsu Chemical Co., Ltd.)

Silane Coupling Agent 3:
N-phenyl-3-aminopropyltrimethoxysilane (KBM-573, manufactured by Shin-Etsu Chemical Co., Ltd.)

Flame Retardant

The following flame retardants 1 and 2 were used.

Flame retardant 1: Aluminum hydroxide (CL310, manufactured by Sumitomo Chemical Co., Ltd.)

Flame retardant 2: A complex metal hydroxide (magnesium hydroxide and zinc hydroxide solid solution, Echomag Z-10, manufactured by Tateho Chemical Industries Co., Ltd.)

Coloring Agent

As a coloring agent, carbon black (MA600) manufactured by Mitsubishi Chemical Corporation was used.

Releasing Agent

As a releasing agent, a carnauba wax (Nikko Carnauba, manufactured by Nikko Fine Products Co., Ltd., melting point: 83 degrees centigrade) was used.

Example 1

The following components were mixed using a mixer at an ambient temperature, and melt-kneaded through a heating roller at 80 to 100 degrees centigrade. After being cooled, the mixture was pulverized to obtain a resin composition for encapsulating a semiconductor.

| | |
|---|---|
| Phenol resin 1 | 5.91 parts by mass |
| Epoxy resin 1 | 6.57 parts by mass |
| Inorganic filler 1 | 86.5 parts by mass |
| Curing accelerator 1 | 0.4 parts by mass |
| Silane coupling agent 1 | 0.07 parts by mass |
| Silane coupling agent 2 | 0.07 parts by mass |
| Silane coupling agent 3 | 0.08 parts by mass |
| Coloring agent | 0.3 parts by mass |
| Releasing agent | 0.1 part by mass |

The resulting resin composition for encapsulating a semiconductor was evaluated with respect to the following items. The evaluation results are shown in Table 2.

Evaluation Items

Spiral Flow

The resin composition was injected into a spiral flow measuring mold built according to EMMI-1-66 under the conditions of a temperature of 175 degrees centigrade, an injection pressure of 6.9 MPa and a pressure application time of 120 seconds, using a low-pressure transfer molding machine (KTS-15 manufactured by Kohtaki Precision Machine Co., Ltd.), and the flow length was measured. The spiral flow is a parameter of flowability, and a greater value indicates higher flowability. The unit is cm. The resin composition obtained in Example 1 exhibited excellent flowability, that is, 121 cm.

Flame Resistance

The resin composition was injection-molded under the conditions of a mold temperature of 175 degrees centigrade, an injection time of 15 seconds, a curing period of 120 seconds and an injection pressure of 9.8 MPa, using a low pressure transfer molding machine (KTS-30, manufactured by Kohtaki Precision Machine Co., Ltd.) to prepare a flame-resistant test piece having a thickness of 3.2 mm. The prepared test piece was subjected to a flame resistance test in accordance with a standard specified in the UL-94 vertical method to determine flame resistance. Fmax, ΣF and rank of flame resistance after determination were shown in Tables. The resin composition obtained in Example 1 exhibited excellent flame resistance, that is, Fmax of 5 seconds, ΣF of 21 seconds and rank of flame resistance of V-0.

Wire Sweeping Ratio

The tabletted resin composition was injected under the conditions of a temperature of 175 degrees centigrade, a pressure of 6.9 MPa, and a time period of 120 seconds, using a low-pressure transfer molding machine to mold respective 10 packages of 208-pin QFP packages for the evaluation test of the amount of wire sweeping (size; 28×28×2.4 mm, a Cu lead frame, test element: 9×9 mm, wire; Au, diameter: 1.2 mils, length: about 5 mm). The molded 208-pin QFP packages were observed with a soft X-ray fluoroscope. As a method of calculating the wire sweeping ratio, the amount of sweeping of the wire that was swept the most (transformed) in one package was (F), and the length of the wire was (L) to calculate the sweeping ratio of F/L×100(%), indicating the mean value of 10 packages. Incidentally, when the wire sweeping ratio was less than 5%, it was acceptable. When it was equal to or more than 5%, it was not acceptable. The resin composition obtained in Example 1 exhibited excellent wire sweeping ratio, that is, 2.9%.

Continuous Molding Property

The obtained resin composition was controlled to have the weight of 15 g and a size of φ18 mm×about 30 mm (height) using a powder molding press (S-20-A, manufactured by Tamagawa Machinery Co., Ltd.) and tabletted under a tablet pressure of 600 Pa to obtain a tablet. A tablet supply magazine with the obtained tablet placed therein was set to the inside of the molding machine. Using a low-pressure automatic transfer molding machine (GP-ELF, manufactured by Dai-ichi Seiko Co., Ltd.) as a molding machine for molding purpose, molding of 400 shots of 80-pin QFP (a Cu lead frame, package outer size: 14 mm×20 mm×2.0 mm (thickness), pad size: 8.0 mm×8.0 mm, chip size: 7.0 mm×7.0 mm×0.35 mm (thickness)) obtained by encapsulating a silicon chip or the like with the resin composition was conducted in a continuous manner under the conditions of a mold temperature of 175 degrees centigrade, a molding pressure of 9.8 MPa and a curing period of 120 seconds. In this case, under the item of "defective filling" in Tables, the number of shots where the molding state (presence or absence of insufficient filling) of the package per every 50 shots was confirmed and the insufficient filling was first confirmed was indicated, or o marks were indicated when insufficient filling was not detected. In addition, the tablet in the magazine set inside the molding machine was in a standby state in the magazine of the molding machine during the period until substantial use for molding, and at a surface temperature of about 30 degrees centigrade, was in a state in which maximum 13 packages were vertically stacked. For supplying and transferring of the tablet in the molding machine, the uppermost tablet was pushed out from the upper part of the magazine by raising the push-up pin from the bottommost part of the magazine, lifted with a mechanical arm, and transferred to the pot for transfer molding. At this time, when the tablet waiting in the magazine was adhered on the upper or lower side, defective transfer took place. Under the item of "defective transfer" in Tables, the number of shots where defective transfer was first confirmed was indicated, or o marks were indicated when defective transfer did not take place. The resin composition obtained in Example 1 exhibited excellent continuous molding property without adhesion of the tablet or insufficient filling of the package during the test.

Solder Resistance Test 1

The resin composition was injected under the conditions of a mold temperature of 180 degrees centigrade, an injection pressure of 7.4 MPa, and a curing period of 120 seconds using a low-pressure transfer molding machine (GP-ELF, manufactured by Dai-ichi Seiko Co., Ltd.) to perform encapsulation molding of a lead frame on which a semiconductor element (silicon chip) was mounted. Thus, a semiconductor device composed of 80p-QFP (a Cu lead frame, size: 14 mm×20 mm×2.00 mm (thickness), semiconductor element size: 7 mm×7 mm×0.35 mm (thickness), the semiconductor element being bonded to an inner lead part of a lead frame using a gold wire having a diameter of 25 μm) was prepared. The prepared six semiconductor devices were post-cured by being heat-treated at 175 degrees centigrade for 4 hours. A humidification process was performed on the six semiconductor devices at 85 degrees centigrade and a relative humidity of 60% for 168 hours, and an IR reflow process (at 260 degrees centigrade in accordance with the condition of JEDEC Level 3) was then performed. The presence or absence of detachment and cracks inside the semiconductor devices after the processes was observed with a scanning acoustic tomograph (mi-scope 10, manufactured by Hitachi Kenki Fine Tech Co., Ltd.). Semiconductor devices in which at least one of detachment or a crack was caused were evaluated as defective. When the number of defective semiconductor devices was n, the result was shown as n/6. The resin composition obtained in Example 1 exhibited excellent reliability, that is, 0/6.

Solder Resistance Test 2

The test was carried out in the same manner as in Solder Resistance Test 1, except that the humidification process conditions in the above Solder Resistance Test 1 were changed to a temperature of 85 degrees centigrade and a relative humidity of 85% for 72 hours. The resin composition obtained in Example 1 exhibited excellent reliability, that is, 0/6.

Examples 2 to 20, Comparative Examples 1 to 5

Resin compositions were produced in the same manner as in Example 1 in accordance with the mixing amounts shown in Tables 2 to 5, and evaluated in the same manner as in Example 1 (the numerical unit of each mixing component in Tables 2 to 5 is parts by mass like Example 1). The evaluation results were shown in Tables 2 to 5.

TABLE 2

|  | Example | | | | | |
|---|---|---|---|---|---|---|
|  | 1 | 2 | 3 | 4 | 5 | 6 |
| Phenol resin 1 | 5.91 |  |  |  | 3.73 | 2.51 |
| Phenol resin 2 |  | 6.00 |  |  |  |  |
| Phenol resin 3 |  |  | 5.90 |  |  |  |
| Phenol resin 4 |  |  |  | 5.71 |  |  |
| Phenol resin 5 |  |  |  |  |  |  |
| Phenol resin 6 |  |  |  |  |  |  |
| Phenol resin 7 |  |  |  |  |  |  |
| Phenol resin 8 |  |  |  |  | 1.60 | 2.51 |
| Epoxy resin 1 | 6.57 | 6.48 | 6.58 | 6.77 | 7.15 | 7.47 |
| Epoxy resin 2 |  |  |  |  |  |  |
| Epoxy resin 3 |  |  |  |  |  |  |
| Epoxy resin 4 |  |  |  |  |  |  |
| Epoxy resin 5 |  |  |  |  |  |  |
| Epoxy resin 6 |  |  |  |  |  |  |
| Epoxy resin 7 |  |  |  |  |  |  |
| Epoxy resin 8 |  |  |  |  |  |  |
| Inorganic filler 1 | 86.5 | 86.5 | 86.5 | 86.5 | 86.5 | 86.5 |

TABLE 2-continued

|  | Example | | | | | |
|---|---|---|---|---|---|---|
|  | 1 | 2 | 3 | 4 | 5 | 6 |
| Curing accelerator 1 | 0.4 | 0.4 | 0.4 | 0.4 | 0.4 | 0.4 |
| Curing accelerator 2 | | | | | | |
| Curing accelerator 3 | | | | | | |
| Curing accelerator 4 | | | | | | |
| Curing accelerator 5 | | | | | | |
| Compound E | | | | | | |
| Flame retardant 1 | | | | | | |
| Flame retardant 2 | | | | | | |
| Silane coupling agent 1 | 0.07 | 0.07 | 0.07 | 0.07 | 0.07 | 0.07 |
| Silane coupling agent 2 | 0.07 | 0.07 | 0.07 | 0.07 | 0.07 | 0.07 |
| Silane coupling agent 3 | 0.08 | 0.08 | 0.08 | 0.08 | 0.08 | 0.08 |
| Coloring agent | 0.3 | 0.3 | 0.3 | 0.3 | 0.3 | 0.3 |
| Releasing agent | 0.1 | 0.1 | 0.1 | 0.1 | 0.1 | 0.1 |
| Spiral flow [cm] | 121 | 113 | 109 | 108 | 109 | 123 |
| Flame resistance test Fmax [sec] | 5 | 4 | 7 | 7 | 7 | 8 |
| Flame resistance test ΣF [sec] | 21 | 19 | 23 | 25 | 28 | 31 |
| Flame resistance test rank | V-0 | V-0 | V-0 | V-0 | V-0 | V-0 |
| Wire sweeping ratio [%] | 2.9 | 3.1 | 3.3 | 3.2 | 3.1 | 3.2 |
| Continuous molding property — Defective filling | ○ | ○ | ○ | ○ | ○ | ○ |
| Continuous molding property — Defective transfer | ○ | ○ | ○ | ○ | ○ | ○ |
| Solder resistance test 1 (number of defective packages in n = 6) | 0/6 | 0/6 | 0/6 | 0/6 | 0/6 | 0/6 |
| Solder resistance test 2 (number of defective packages in n = 6) | 0/6 | 0/6 | 0/6 | 0/6 | 0/6 | 0/6 |

TABLE 3

|  | Example | | | | | | |
|---|---|---|---|---|---|---|---|
|  | 7 | 8 | 9 | 10 | 11 | 12 | 13 |
| Phenol resin 1 | 5.99 | 5.90 | 5.18 | 5.18 | 5.54 | 5.32 | 5.45 |
| Phenol resin 2 | | | | | | | |
| Phenol resin 3 | | | | | | | |
| Phenol resin 4 | | | | | | | |
| Phenol resin 5 | | | | | | | |
| Phenol resin 6 | | | | | | | |
| Phenol resin 7 | | | | | | | |
| Phenol resin 8 | | | | | | | |
| Epoxy resin 1 | 6.64 | | | | 2.84 | 1.46 | 2.87 |
| Epoxy resin 2 | | 6.73 | | | | | |
| Epoxy resin 3 | | | 7.45 | | | | |
| Epoxy resin 4 | | | | 5.59 | | | |
| Epoxy resin 5 | | | | 1.86 | | | |
| Epoxy resin 6 | | | | | 4.26 | | |
| Epoxy resin 7 | | | | | | 5.85 | |
| Epoxy resin 8 | | | | | | | 4.31 |
| Inorganic filler 1 | 86.5 | 86.5 | 86.5 | 86.5 | 86.5 | 86.5 | 86.5 |
| Curing accelerator 1 | | | | | | | |
| Curing accelerator 2 | | | | | | | |
| Curing accelerator 3 | 0.25 | 0.25 | 0.25 | 0.25 | 0.25 | 0.25 | 0.25 |
| Curing accelerator 4 | | | | | | | |
| Curing accelerator 5 | | | | | | | |
| Compound E | | | | | | | |
| Flame retardant 1 | | | | | | | |
| Flame retardant 2 | | | | | | | |
| Silane coupling agent 1 | 0.07 | 0.07 | 0.07 | 0.07 | 0.07 | 0.07 | 0.07 |
| Silane coupling agent 2 | 0.07 | 0.07 | 0.07 | 0.07 | 0.07 | 0.07 | 0.07 |
| Silane coupling agent 3 | 0.08 | 0.08 | 0.08 | 0.08 | 0.08 | 0.08 | 0.08 |
| Coloring agent | 0.3 | 0.3 | 0.3 | 0.3 | 0.3 | 0.3 | 0.3 |
| Releasing agent | 0.1 | 0.1 | 0.1 | 0.1 | 0.1 | 0.1 | 0.1 |
| Spiral flow [cm] | 123 | 114 | 112 | 104 | 113 | 111 | 105 |
| Flame resistance test Fmax [sec] | 5 | 8 | 5 | 2 | 4 | 8 | 7 |
| Flame resistance test ΣF [sec] | 21 | 23 | 23 | 8 | 19 | 32 | 28 |
| Flame resistance test rank | V-0 | V-0 | V-0 | V-0 | V-0 | V-0 | V-0 |

TABLE 3-continued

|  |  | Example | | | | | | |
|---|---|---|---|---|---|---|---|---|
|  |  | 7 | 8 | 9 | 10 | 11 | 12 | 13 |
| Wire sweeping ratio [%] | | 2.9 | 3.2 | 3.4 | 3.4 | 3.6 | 3.1 | 3.2 |
| Continuous molding property | Defective filling | ○ | ○ | ○ | ○ | ○ | ○ | ○ |
|  | Defective transfer | ○ | ○ | ○ | ○ | ○ | ○ | ○ |
| Solder resistance test 1 (number of defective packages in n = 6) | | 0/6 | 0/6 | 0/6 | 0/6 | 0/6 | 0/6 | 0/6 |
| Solder resistance test 2 (number of defective packages in n = 6) | | 0/6 | 0/6 | 0/6 | 0/6 | 0/6 | 0/6 | 0/6 |

TABLE 4

|  |  | Example | | | | | | |
|---|---|---|---|---|---|---|---|---|
|  |  | 14 | 15 | 16 | 17 | 18 | 19 | 20 |
| Phenol resin 1 | | | | | | | | |
| Phenol resin 2 | | 5.28 | 5.26 | 5.34 | 5.34 | 5.34 | | |
| Phenol resin 3 | | | | | | | | |
| Phenol resin 4 | | | | | | | 4.96 | 4.96 |
| Phenol resin 5 | | | | | | | | |
| Phenol resin 6 | | | | | | | | |
| Phenol resin 7 | | | | | | | | |
| Phenol resin 8 | | | | | | | | |
| Epoxy resin 1 | | | | | | | | |
| Epoxy resin 2 | | 2.88 | 2.87 | 2.91 | 2.91 | 2.91 | | |
| Epoxy resin 3 | | | | | | | | |
| Epoxy resin 4 | | 4.32 | 4.30 | 4.37 | 4.37 | 4.37 | | |
| Epoxy resin 5 | | | | | | | | |
| Epoxy resin 6 | | | | | | | | |
| Epoxy resin 7 | | | | | | | | |
| Epoxy resin 8 | | | | | | | 7.47 | 7.47 |
| Inorganic filler 1 | | 86.5 | 86.5 | 86.5 | 86.5 | 86.5 | 82.5 | 82.5 |
| Curing accelerator 1 | | 0.4 | | | | | | |
| Curing accelerator 2 | | | 0.45 | | | | 0.45 | 0.45 |
| Curing accelerator 3 | | | | 0.25 | | | | |
| Curing accelerator 4 | | | | | 0.25 | | | |
| Curing accelerator 5 | | | | | | 0.2 | | |
| Compound E | | | | | | 0.05 | | |
| Flame retardant 1 | | | | | | | 4.0 | |
| Flame retardant 2 | | | | | | | | 4.0 |
| Silane coupling agent 1 | | 0.07 | 0.07 | 0.07 | 0.07 | 0.07 | 0.07 | 0.07 |
| Silane coupling agent 2 | | 0.07 | 0.07 | 0.07 | 0.07 | 0.07 | 0.07 | 0.07 |
| Silane coupling agent 3 | | 0.08 | 0.08 | 0.08 | 0.08 | 0.08 | 0.08 | 0.08 |
| Coloring agent | | 0.3 | 0.3 | 0.3 | 0.3 | 0.3 | 0.3 | 0.3 |
| Releasing agent | | 0.1 | 0.1 | 0.1 | 0.1 | 0.1 | 0.1 | 0.1 |
| Spiral flow [cm] | | 105 | 104 | 97 | 104 | 113 | 106 | 104 |
| Flame resistance test Fmax [sec] | | 5 | 5 | 5 | 5 | 5 | 3 | 2 |
| Flame resistance test ΣF [sec] | | 21 | 21 | 21 | 21 | 21 | 8 | 9 |
| Flame resistance test rank | | V-0 | V-0 | V-0 | V-0 | V-0 | V-0 | V-0 |
| Wire sweeping ratio [%] | | 3.8 | 2.9 | 3.6 | 3.9 | 3.5 | 3.7 | 4.1 |
| Continuous molding property | Defective filling | ○ | ○ | ○ | ○ | ○ | ○ | ○ |
|  | Defective transfer | ○ | ○ | ○ | ○ | ○ | ○ | ○ |
| Solder resistance test 1 (number of defective packages in n = 6) | | 0/6 | 0/6 | 0/6 | 0/6 | 0/6 | 0/6 | 0/6 |
| Solder resistance test 2 (number of defective packages in n = 6) | | 0/6 | 0/6 | 0/6 | 0/6 | 0/6 | 0/6 | 0/6 |

TABLE 5

| | Comparative Example | | | | |
|---|---|---|---|---|---|
| | 1 | 2 | 3 | 4 | 5 |
| Phenol resin 1 | | | | | |
| Phenol resin 2 | | | | | |
| Phenol resin 3 | | | | | |
| Phenol resin 4 | | | | | |
| Phenol resin 5 | 5.79 | | | 2.89 | 3.02 |
| Phenol resin 6 | | 5.77 | | 2.89 | |
| Phenol resin 7 | | | 6.28 | | 3.02 |
| Phenol resin 8 | | | | | |
| Epoxy resin 1 | 6.69 | 6.71 | 6.20 | 6.70 | 6.44 |
| Epoxy resin 2 | | | | | |
| Epoxy resin 3 | | | | | |
| Epoxy resin 4 | | | | | |
| Epoxy resin 5 | | | | | |
| Epoxy resin 6 | | | | | |
| Epoxy resin 7 | | | | | |
| Epoxy resin 8 | | | | | |
| Inorganic filler 1 | 86.5 | 86.5 | 86.5 | 86.5 | 86.5 |
| Curing accelerator 1 | 0.4 | 0.4 | 0.4 | 0.4 | 0.4 |
| Curing accelerator 2 | | | | | |
| Curing accelerator 3 | | | | | |
| Curing accelerator 4 | | | | | |
| Curing accelerator 5 | | | | | |
| Compound E | | | | | |
| Flame retardant 1 | | | | | |
| Flame retardant 2 | | | | | |
| Silane coupling agent 1 | 0.07 | 0.07 | 0.07 | 0.07 | 0.07 |
| Silane coupling agent 2 | 0.07 | 0.07 | 0.07 | 0.07 | 0.07 |
| Silane coupling agent 3 | 0.08 | 0.08 | 0.08 | 0.08 | 0.08 |
| Coloring agent | 0.3 | 0.3 | 0.3 | 0.3 | 0.3 |
| Releasing agent | 0.1 | 0.1 | 0.1 | 0.1 | 0.1 |
| Spiral flow [cm] | 103 | 94 | 92 | 99 | 86 |
| Flame resistance test Fmax [sec] | 16 | 30 | 5 | 30 | 11 |
| Flame resistance test ΣF [sec] | 35 | 150 | 21 | 150 | 34 |
| Flame resistance test rank | V-1 | Burnout | V-0 | Burnout | V-1 |
| Wire sweeping ratio [%] | 3.9 | 5.5 | 6 | 4.9 | 6 |
| Continuous molding property — Defective filling | 300 | 150 | 100 | 200 | 150 |
| Continuous molding property — Defective transfer | 185 | ○ | ○ | ○ | ○ |
| Solder resistance test 1 (number of defective packages in n = 6) | 1/6 | 0/6 | 0/6 | 0/6 | 0/6 |
| Solder resistance test 2 (number of defective packages in n = 6) | 3/6 | 2/6 | 1/6 | 2/6 | 2/6 |

Each of Examples 1 to 20 includes a composition containing a phenol resin (A) having a component (A1) composed of a polymer having a structural unit represented by the formula (1) and a structural unit represented by the formula (2); an epoxy resin (B); and an inorganic filler (C), one obtained by changing the mixing ratio of the structural unit of the phenol resin (A), one containing other curing agent in addition to the phenol resin (A), one obtained by changing the kind of the epoxy resin (B), one obtained by changing the kind of the curing accelerator (D), or one obtained by changing the kind of the flame retardant. The results showed that all of Examples 1 to 20 exhibited an excellent balance among flowability (spiral flow), wire sweeping ratio, flame resistance, wire sweeping ratio, continuous molding property and solder resistance.

On the other hand, in Comparative Example 1 changing its component to the phenol resin 5 having a structural unit represented by the formula (1) but without having a structural unit represented by the formula (2), in respective Comparative Examples 2 and 3 changing its component to the phenol resins 6 and 7 having a structural unit represented by the formula (2) but without having a structural unit represented by the formula (1), and in respective Comparative Examples 4 and 5 using the phenol resin 5, 6 or 7 together, the results showed that all items of flowability (spiral flow), wire sweeping ratio, flame resistance, continuous molding property and solder resistance were not sufficient and a balance of properties was inferior.

As shown in the above results, only when a phenol resin (A) including a component (A1) composed of a polymer having a structural unit represented by the formula (1) and a structural unit represented by the formula (2) was used as a curing agent, the results showed that the resin composition containing a curing agent, an epoxy resin and an inorganic filler exhibited an excellent balance among flowability (spiral flow), wire sweeping ratio, flame resistance, continuous molding property and solder resistance. More remarkable effects were obtained than predicted or expected when a phenol resin having a structural unit represented by the formula (1) alone or a phenol resin having a structural unit represented by the formula (2) alone was used as a curing agent, or when both phenol resins were used together.

According to respective Examples, there is obtained a resin composition for encapsulating a semiconductor excellent in a balance among flowability (spiral flow), wire sweeping ratio, handling property, solder resistance, flame resistance and continuous molding property, so that the resin composition is suitable for encapsulating a semiconductor device, in particular, a package having a structure obtained by laminating chips inside one package or a semiconductor device with a wire diameter thinner than the semiconductor device the related art.

Incidentally, it is to be understood that the aforementioned embodiments and a plurality of modifications may be made without departing from the scope of the invention. Furthermore, the structures of respective portions and the like are described in the aforementioned embodiments and modifications in detail, but the structures may be modified in many ways within the range of the present invention.

This application is based on Japanese patent application No. 2009-134319 filed on Jun. 13, 2009, the content of which is incorporated hereinto by reference.

The invention claimed is:

1. A resin composition for encapsulating a semiconductor comprising a phenol resin (A) having one or more components containing a component (A1) composed of a polymer having a structural unit represented by the following general formula (1) and a structural unit represented by the following general formula (2);
an epoxy resin (B); and
an inorganic filler (C),

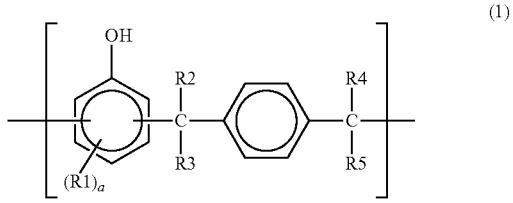

wherein, in the above general formula (1), R1 is each independently a hydrocarbon group having 1 to 6 carbon atoms; a is an integer of 0 to 3; and R2, R3, R4 and R5 are each independently a hydrogen atom or a hydrocarbon group having 1 to 6 carbon atoms,

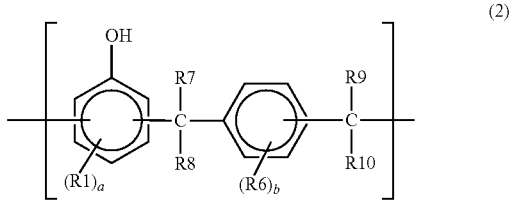

(2)

wherein, in the above general formula (2), R1 is each independently a hydrocarbon group having 1 to 6 carbon atoms; a is an integer of 0 to 3; R6 is each independently a hydrocarbon group having 1 to 6 carbon atoms; b is an integer of 1 to 4; and R7, R8, R9 and R10 are each independently a hydrogen atom or a hydrocarbon group having 1 to 6 carbon atoms, wherein the ICI viscosity at 150 degrees centigrade of said phenol resin (A) is equal to or less than 1.5 dPa·s;

wherein a mixing amount of the phenol resin (A) is equal to or more than 0.5% by mass and equal to or less than 10% by mass based on the total mass of the resin composition;

wherein a mixing amount of the epoxy resin (B) is equal to or more than 2% by mass and equal to or less than 15% by mass based on the total mass of the resin composition; and wherein the content of said inorganic filler (C) is equal to or more than 80% by mass and equal to or less than 93% by mass.

2. The resin composition for encapsulating a semiconductor according to claim 1, wherein said component (A1) is composed of one or more polymers, and in the measurement by the field desorption mass spectrometry, the total relative intensity of polymers corresponding to said component (A1) is equal to or more than 10% and equal to or less than 80%, based on the total relative intensity of said phenol resin (A).

3. The resin composition for encapsulating a semiconductor according to claim 1, wherein said phenol resin (A) further comprises a component (A2) composed of a polymer having the structural unit represented by said general formula (1) but without having the structural unit represented by said general formula (2).

4. The resin composition for encapsulating a semiconductor according to claim 1, wherein said phenol resin (A) further comprises a component (A3) composed of a polymer having the structural unit represented by said general formula (2) but without having the structural unit represented by said general formula (1).

5. The resin composition for encapsulating a semiconductor according to claim 1, wherein the ratio of the total number of structural units represented by said general formula (1) to the total number of structural units represented by said general formula (2) is from 30/70 to 95/5, based on the total amount of said phenol resin (A).

6. The resin composition for encapsulating a semiconductor according to claim 1, wherein, in the structural unit represented by said general formula (2), R6 is a methyl group, and b is from 1 to 3.

7. The resin composition for encapsulating a semiconductor according to claim 1, wherein the softening point of said phenol resin (A) is equal to or more than 63 degrees centigrade and equal to or less than 85 degrees centigrade.

8. The resin composition for encapsulating a semiconductor according to claim 1, wherein the area ratio of binuclear components in said phenol resin (A) is equal to or less than 20% according to the gel permeation chromatography (GPC) method in terms of standard polystyrene.

9. The resin composition for encapsulating a semiconductor according claim 1,
wherein said phenol resin (A) is included as a curing agent in the resin composition, and
wherein said phenol resin (A) is contained in an amount of equal to or more than 20% by mass and equal to or less than 100% by mass, based on the total curing agent.

10. The resin composition for encapsulating a semiconductor according to claim 1, wherein said epoxy resin (B) is at least one epoxy resin selected from the group consisting of a biphenyl type epoxy resin, a bisphenol type epoxy resin, a stilbene type epoxy resin, an anthracenediol type epoxy resin, a phenol novolac type epoxy resin, a cresol novolac type epoxy resin, a triphenol methane type epoxy resin, an alkyl-modified triphenol methane type epoxy resin, a phenol aralkyl type epoxy resin having a phenylene skeleton, a phenol aralkyl type epoxy resin having a biphenylene skeleton, a naphthol aralkyl type epoxy resin having a phenylene skeleton, a dihydroxy naphthalene type epoxy resin, an epoxy resin obtained by glycidyl etherification of dimers of dihydroxy naphthalene, a novolac type epoxy resin having a methoxynaphthalene skeleton, triglycidyl isocyanurate, monoallyl diglycidyl isocyanurate and a dicyclopentadiene-modified phenol type epoxy resin.

11. The resin composition for encapsulating a semiconductor according to claim 1, further comprising a curing accelerator (D).

12. The resin composition for encapsulating a semiconductor according to claim 11, wherein said curing accelerator (D) comprises at least one curing accelerator selected from the group consisting of a tetra-substituted phosphonium compound, a phosphobetaine compound, an adduct of a phosphine compound and a quinone compound, and an adduct of a phosphonium compound and a silane compound.

13. The resin composition for encapsulating a semiconductor according to claim 1, further comprising a compound (E) in which a hydroxyl group is bonded to each of two or more adjacent carbon atoms constituting an aromatic ring.

14. The resin composition for encapsulating a semiconductor according to claim 1, further comprising a coupling agent (F).

15. The resin composition for encapsulating a semiconductor according to claim 14, wherein said coupling agent (F) comprises a silane coupling agent having a secondary amino group.

16. The resin composition for encapsulating a semiconductor according to claim 1, further comprising an inorganic flame retardant (G).

17. The resin composition for encapsulating a semiconductor according to claim 16, wherein said inorganic flame retardant (G) comprises metal hydroxide or complex metal hydroxide.

18. A semiconductor device obtained by encapsulating a semiconductor element with a cured product of the resin composition for encapsulating a semiconductor according to claim 1.

* * * * *